United States Patent
Osugi et al.

(10) Patent No.: US 7,561,384 B2
(45) Date of Patent: Jul. 14, 2009

(54) MAGNETO-RESISTIVE SENSOR HAVING SMALL TRACK WIDTH AND SENSOR HEIGHT USING STOPPER LAYER

(75) Inventors: Masahiro Osugi, Kanagawa (JP); Taku Shintani, Kanagawa (JP); Katsuro Watanabe, Ibaraki (JP); Nobuo Yoshida, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 500 days.

(21) Appl. No.: 11/289,798

(22) Filed: Nov. 29, 2005

(65) Prior Publication Data
US 2006/0132983 A1    Jun. 22, 2006

(30) Foreign Application Priority Data
Dec. 21, 2004    (JP)    .............. 2004-369118

(51) Int. Cl.
  *G11B 5/39*    (2006.01)
(52) U.S. Cl. ................................... 360/324.1
(58) Field of Classification Search ................. 360/319, 360/324.1–324.2; 29/603.13–603.15
See application file for complete search history.

(56) References Cited

U.S. PATENT DOCUMENTS 7,005,201 B2 *    2/2006    Hasegawa et al. ........ 428/811.5

2004/0027731 A1    2/2004    Hasegawa et al.
2004/0072021 A1    4/2004    Hasegawa et al.
2004/0080873 A1    4/2004    Shintani et al.

FOREIGN PATENT DOCUMENTS

| JP | 2003-132509 | 5/2003 |
|---|---|---|
| JP | 2004-031882 | 1/2004 |
| JP | 2004-119755 | 4/2004 |
| JP | 2004-152334 | 5/2004 |
| JP | 2004-186673 | 7/2004 |

* cited by examiner

*Primary Examiner*—A. J. Heinz
(74) *Attorney, Agent, or Firm*—Townsend and Townsend and Crew LLP; Rambod Nader

(57) ABSTRACT

A high output magneto-resistive sensor is provided by suppressing leftover resist mask after lift-off and generation of a fence, and by making it easy to remove the redepositions deposited on the side wall in the track width direction or on the side wall in the sensor height direction of the magnetoresistive film. As a means to solve a fence and lift-off leftover of a resist in a process for forming a track and a process for forming a sensor height, a stopper layer is provided on the magnetoresistive film and the stopper layer on the refill film, and performing lift-off by CMP. By using a metallic material which has a small CMP polishing rate for at least the first stopper layer, the magnetoresistive film and the first stopper layer can be etched simultaneously and a pattern formed. As a result, decrease of the height of the resist mask by RIE can be suppressed and lift-off leftover can be prevented.

6 Claims, 28 Drawing Sheets

FIG. 9
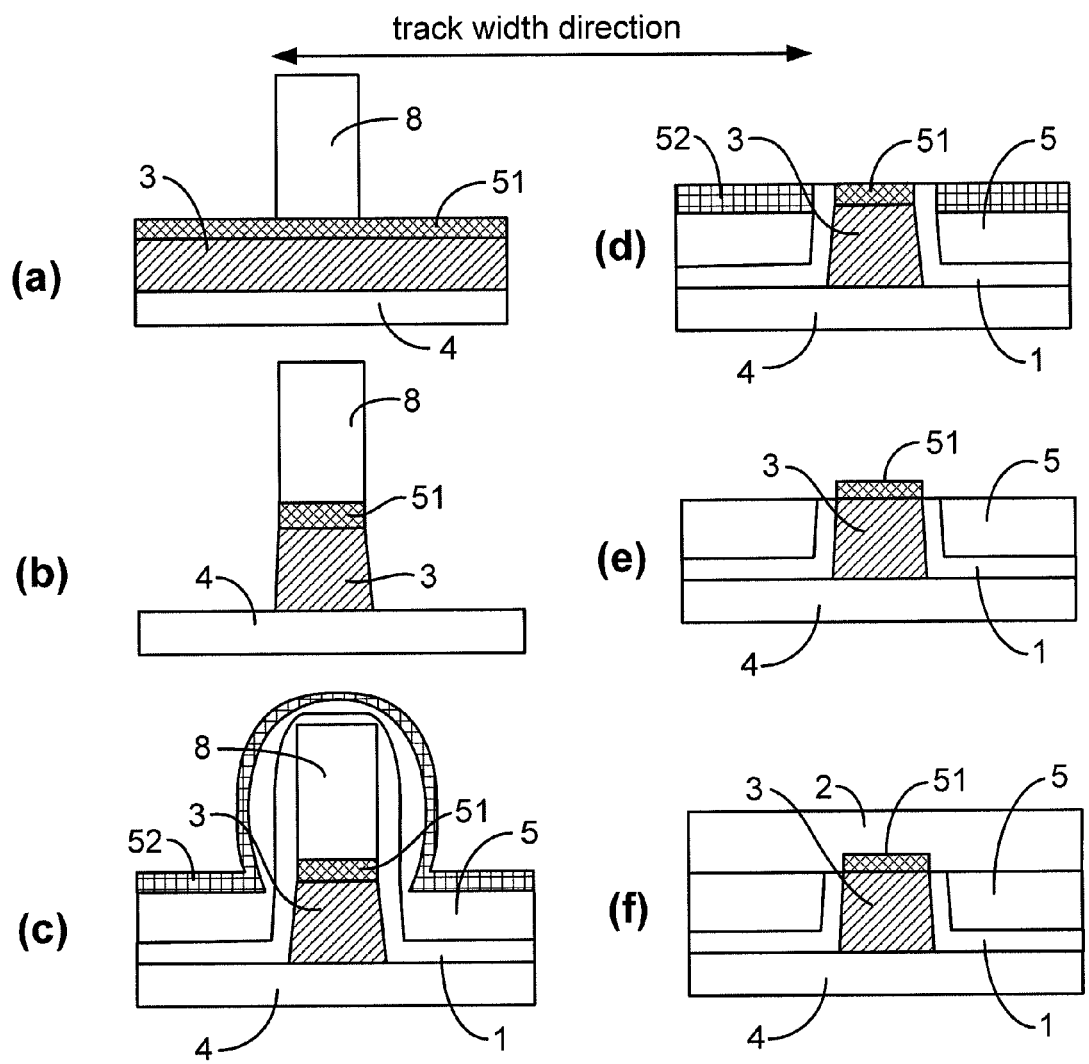
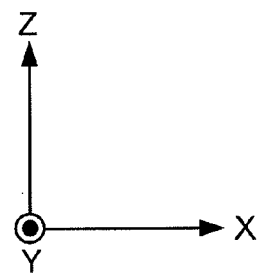

Fig. 11
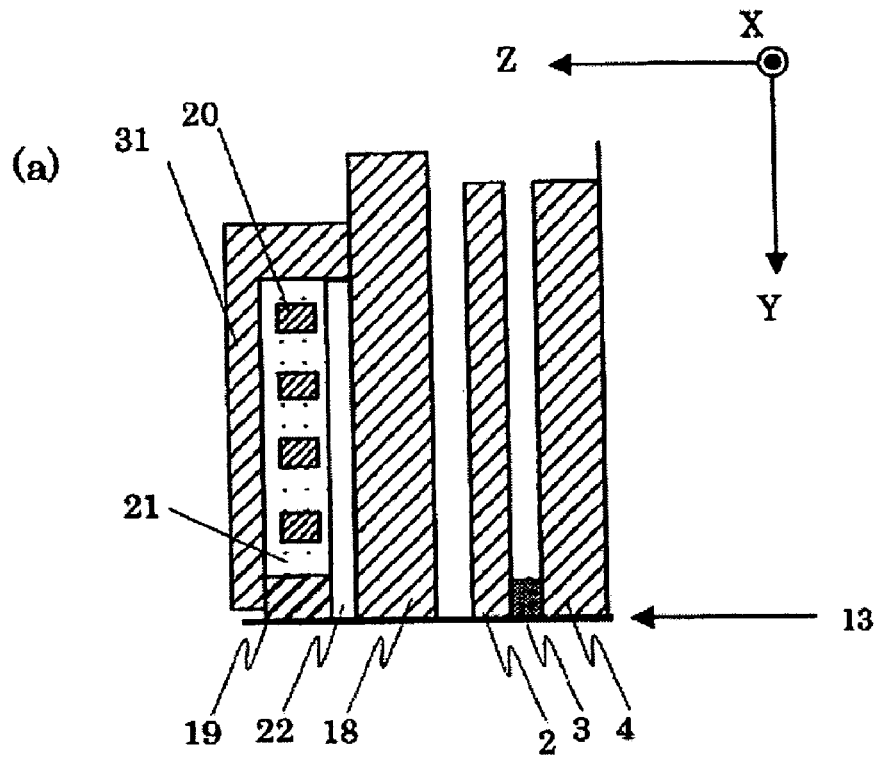
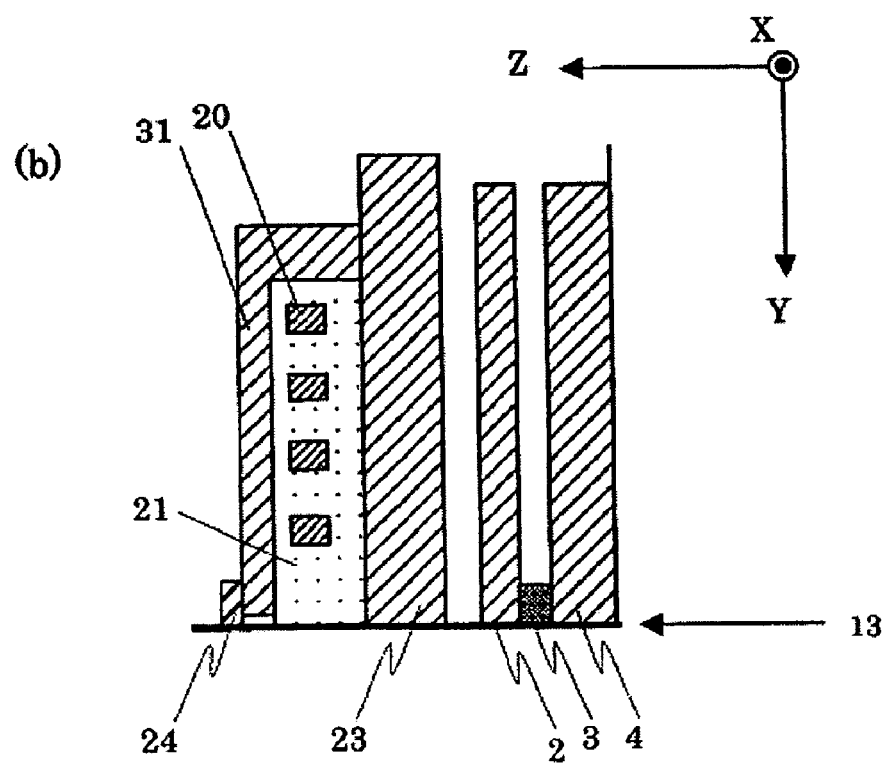

FIG. 24
(a)
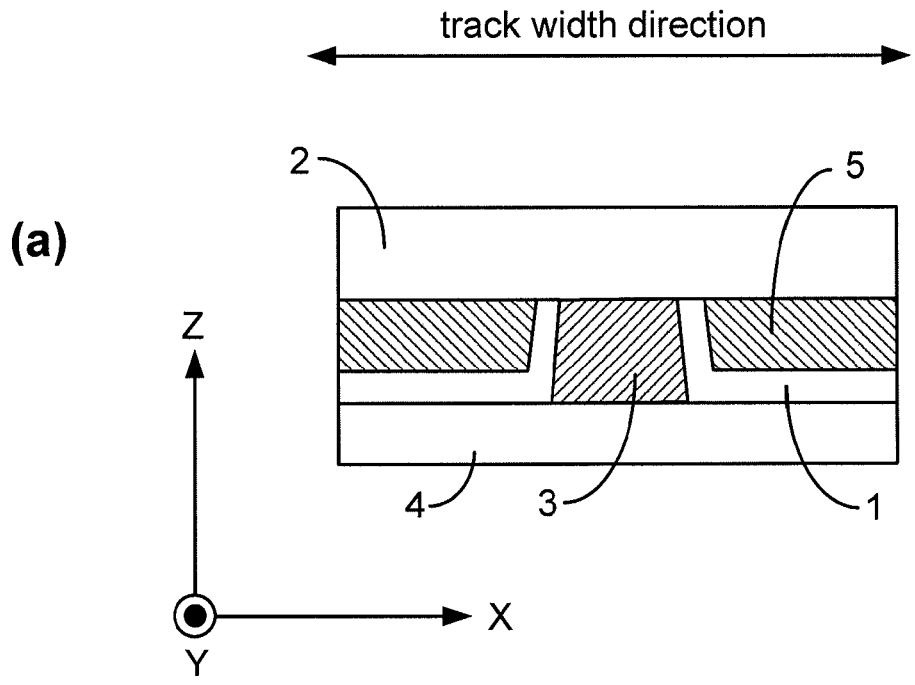
(b)
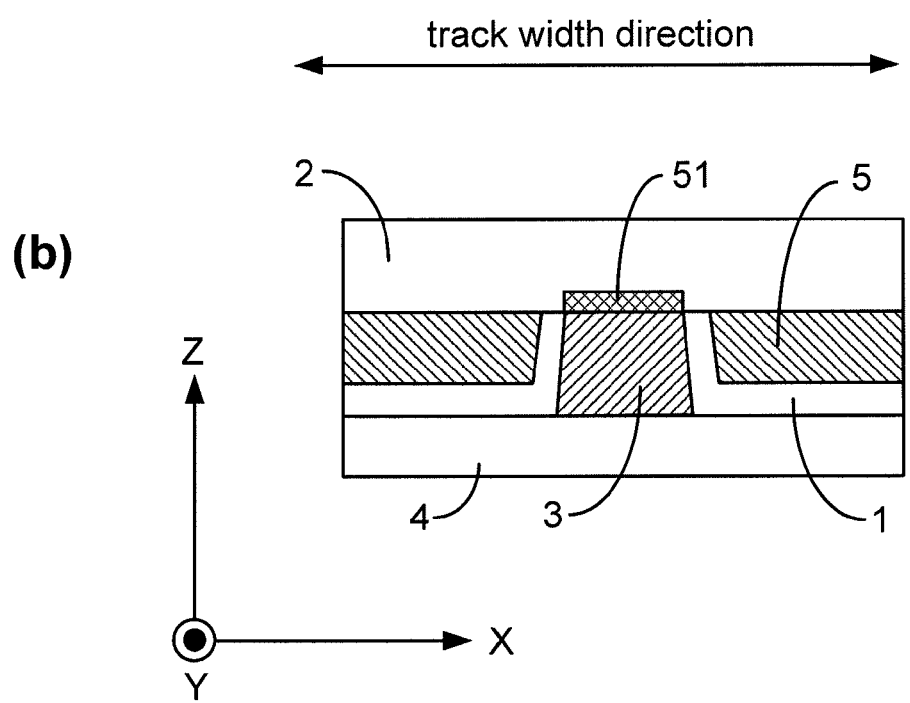

FIG. 29
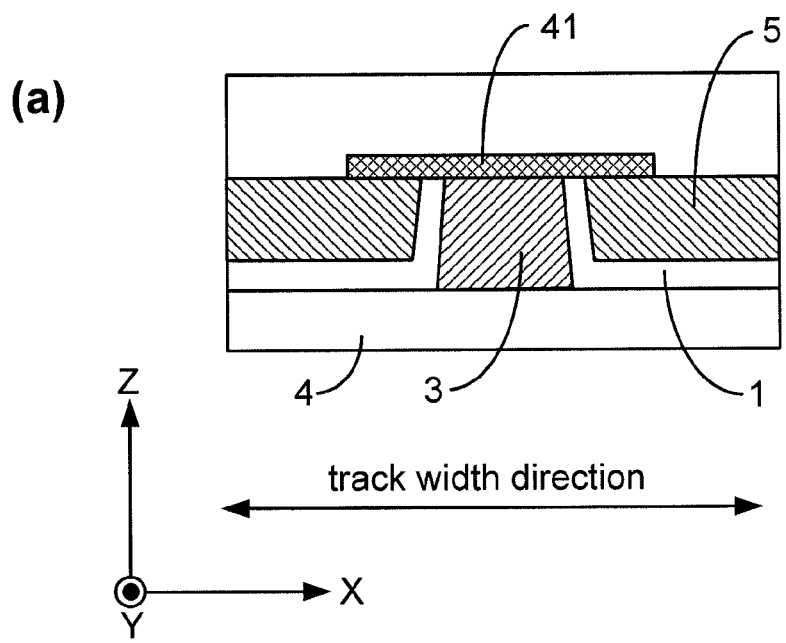
(a)
track width direction
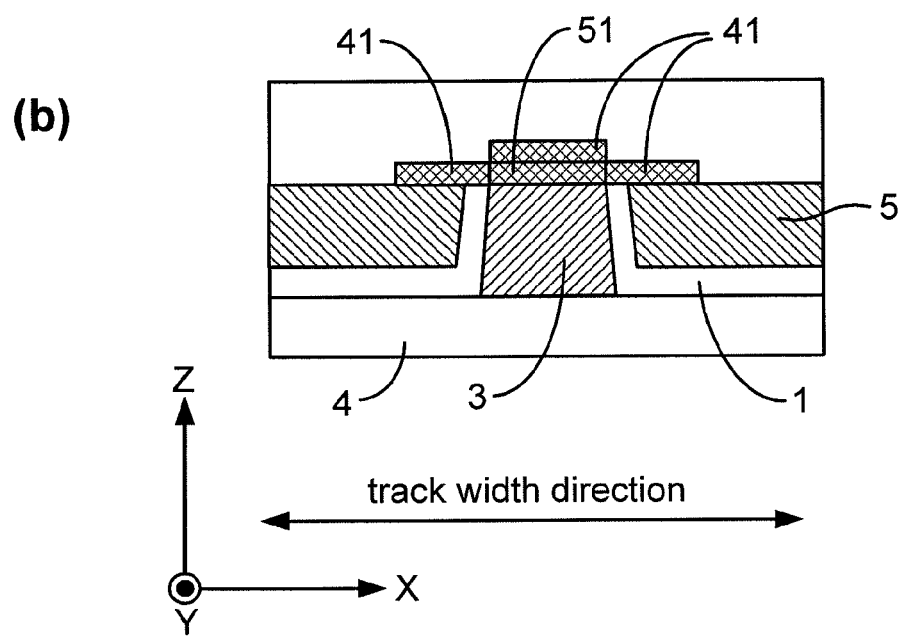
(b)
track width direction

MAGNETO-RESISTIVE SENSOR HAVING SMALL TRACK WIDTH AND SENSOR HEIGHT USING STOPPER LAYER

CROSS-REFERENCES TO RELATED APPLICATIONS

This application claims priority from Japanese Patent Application No. JP2004-369118, filed Dec. 21, 2004, the entire disclosure of which is incorporated herein by reference.

BACKGROUND OF THE INVENTION

The present invention relates to a magneto-resistive sensor reproducing magnetically recorded information and a magnetic storage mounting it. Particularly, it relates to a magneto-resistive sensor having a high output and a fabricating method thereof, a magnetic head using it, and a magnetic storage mounting it.

A magneto-resistive sensor utilizing a magnetoresistance, in which the electrical resistance changes according to changes in an external magnetic field, is well known as an excellent magnetic field sensor, and has been put to practical use as a read sensor for detecting a signal field from a magnetic recording medium which is a main part of a magnetic storage.

The recording density of a magnetic storage has been remarkably improved, and a magneto-resistive sensor has required not only a narrowing of the track width but also high performance in both recording and reproducing properties. With regard to the reproducing properties there has been progress in making high sensitivity by developing an MR head utilizing a magnetoresistance. When the recording density was several Gb/in$^2$, magnetic signals on a recording medium were converted to electric signals by using an anisotropic magnetoresistance (AMR), but a higher sensitivity giant magnetoresistance (GMR) is employed when the recording density becomes higher. In addition, a method bringing the advantage of making high sensitivity (CPP type), in which a detecting current flows nearly in the direction perpendicular to the film plane, has been developed for the requirement of making higher recording density attendant with a narrowing of the gap between the upper shield layer and the lower shield layer (reproducing gap length), and magneto-resistive sensors using CPP-GMR and a tunneling magnetoresistance (TMR) have been reported.

A basic structure of CPP type magneto-resistive sensor will be described. FIG. 1 is a cross-sectional drawing in the track width direction at a position where a magnetoresistive film 3 is placed. The X, Y, and Z axes illustrated in FIG. 1 show the directions of track width, sensor height, and film thickness of the magnetoresistive film, respectively. In the following figures, the X, Y, and Z axes are assumed to be the ones indicating axes identical to the X, Y, and Z axes shown in FIG. 1, respectively. A refill film along track width direction 1 is provided and connected to the wall of the magnetoresistive film 3. A longitudinal bias layer and a side shield layer 5 may not be necessary. Moreover, in FIGS. 1, 2 denotes an upper shield layer and 4 denotes a lower shield layer. FIG. 2 is a cross-sectional drawing in the sensor height direction of a CPP type magneto-resistive sensor cut at the position of line aa' shown in FIG. 1. In FIG. 2, the right side is an air bearing surface 13 of the magneto-resistive sensor. As the same as the track width direction, the refill film along sensor height direction 6 is provided and connected to the wall of the magnetoresistive film 3. At least the parts of the refill film along track width direction 1 and the refill film along sensor height direction 6 connected to the magnetoresistive film 3 are formed of insulator films.

A narrower track width of the magnetoresistive film 3 has an advantage to make a higher recording density because the size of information recorded in the medium as magnetic signals can be made smaller. Moreover, in order to achieve a high recording density, it is necessary to make the sensor height smaller. This is because sensitivity is improved by placing the magnetoresistive film 3 only in the vicinity of the surface of the air bearing surface 13 which is the place easiest to sense magnetic field, and a magneto-resistive sensor producing a required output is realized even if the track width and the gap between the shields are made smaller to improve the recording density.

However, there are some problems which should be solved to make it smaller. At first, a problem which arises while forming a track will be explained. FIG. 3 is a process flow drawing illustrating a process for forming a track of a CPP type magneto-resistive sensor. After a resist mask 8 with a predetermined size is formed at the region which becomes a read element on the magnetoresistive film 3 deposited on the lower shield layer (FIG. 3(*a*)), the region except for the read element is etched by an etching technique (FIG. 3(*b*)). Ion beam etching is generally used in this etching process. After etching, the refill film along track width direction 1 is deposited. As shown in FIG. 3, in some cases, the side shield film or the longitudinal bias layer 5 may be deposited on the refill film along track width direction 1 (FIG. 3(*c*)). Next, lift-off is carried out using an organic solvent. In the case when the track width of the resist mask 8 is narrower, the resist mask 8 may not be lifted off. Even in the case when lift-off is possible, a fence 9 may be created (FIG. 3(*d*)). After this process, the upper shield layer 2 which also works as an upper electrode is deposited on the magnetoresistive film 3, but, in the case when the fence is created, a region 12 where the upper shield layer 2 is not deposited is created at the part in the shade of the fence 9. It is expected that contact failure arises caused by the region 12 where the magnetic shield layer 2 is not deposited because of the shade of the fence 9 (FIG. 3(*e*)), such that conduction may not be obtained between the upper shield layer 2 and the magnetoresistive film 3.

Next, a problem which arises while forming a sensor height will be explained. FIG. 4 is a process flow drawing illustrating a process for forming a sensor height of a CPP type magnetoresistive sensor. After a resist mask 11 with a predetermined size is formed at the region which becomes a read element on the magnetoresistive film 3 deposited on the lower shield layer (FIG. 4(*a*)), the region except for the read element is etched by an etching technique (FIG. 4(*b*)). An ion beam etching technique using Ar ions is generally used in this etching process. After etching, the refill film along sensor height direction 6 is deposited (FIG. 4(*c*)). Next, the resist mask 11 and excess refill film are removed (lift-off) using an organic solvent, but, in the case when the width of the resist mask 11 in the sensor height direction is narrow, the resist mask 11 may not be lifted off. Even in the case when lift-off is possible, a fence 10 may be created (FIG. 4(*d*)). After this process, the upper shield layer 2 which also works as an upper electrode is deposited on the magnetoresistive film 3, but, in the case when the fence is created, a region 14 where the upper shield layer 2 is not deposited is created at the part in the shade of the fence 10, resulting in contact failure arising in the vicinity of the fence 10 (FIG. 4(*e*)). Moreover, after this process, the air bearing surface 13 is formed after polishing the sensor height to a predetermined size using a lapping process. However, in the case when there is a region 14 where the upper shield layer 2 is not deposited caused by the shade of the fence 10, conduction may not be obtained between the upper shield layer 2 and the magnetoresistive film 3 (FIG. 4(f)).

As a means to avoid this lift-off failure and creation of a fence, JP-A No. 186673/2004 and JP-A No. 132509/2003 disclose methods in which the resist pattern and fence are removed by carrying out CMP (chemical mechanical polishing method) during the lift-off process. It is described in the previous publications that damage can be avoided by providing a first stopper layer on the magnetoresistive film and a second stopper layer on the refill film because damage may be imparted to the top faces of the magnetoresistive film and the refill film while removing the resist pattern and the fence in the case when CMP is used. These stopper layers are composed of a DLC (diamond like carbon).

The first stopper layer to protect this magnetoresistive film is deposited on the magnetoresistive film. Moreover, a resist mask with a predetermined size is formed on top of it, and then it is etched with the magnetoresistive film. JP-A No. 186673/2004 discloses that only the first stopper layer is etched by reactive ion etching (RIE), and the magnetoresistive film is etched by ion beam etching (IBE). This is because the etching rate of DLC using IBE is significantly lower than that of a metallic material constituting the magnetoresistive film. For instance, in the case when etching was carried out under the condition of an acceleration voltage of 200 V, an ion current of 0.10 A, an RF output of 400 W, and an IBE angle of 10 degrees, the etching rate of a Ni—Fe alloy was 380 A/min and the etching rate of DLC was 80 A/min.

However, there is a case where the height of the resist mask is reduced due to RIE, resulting in lift-off by CMP becoming difficult. This is a problem which becomes particularly apparent when the track width and the sensor height are made smaller. In order to make the track width and the sensor height smaller, it is necessary to make smaller the size of the resist mask in the track width direction and the sensor height direction. In order to realize this, it is necessary to make the height of the resist mask smaller; otherwise, the resist mask falls down, making it impossible to form the pattern. It is known that the limitation of the ratio of the dimension in the track width direction or the sensor height direction to the height of the resist mask (aspect ratio) is 3 to 4. For instance, it is necessary to have a resist mask with a height of 200 nm or less in order to make the dimension of the resist mask in the track width direction or the sensor height direction 50 nm. The height of the resist mask is reduced by using two etching processes which are the process for etching the first stopper layer composed of DLC by using RIE and a process for etching the magnetoresistive film by using IBE, as mentioned above. Actually, the height of the resist mask became about 50 nm when a first stopper layer composed of DLC was deposited on the magnetoresistive film deposited on the lower shield layer, and a resist mask was formed with a height of 200 nm and a dimension in the track width direction of 50 nm, when these two etching processes were applied. After this process, when a refill film and a second stopper layer composed of DLC were formed to protect the refill film and lift-off was carried out by using CMP, 85% of the sensor could not be lifted off and the resist mask could not be removed. This is because lift-off by CMP became difficult due to the height of the resist mask being small.

BRIEF SUMMARY OF THE INVENTION

As mentioned above, the problem of a lift-off technology by a conventional CMP using a stopper layer composed of DLC is in the point that the height of the resist mask becomes smaller when a narrower track width and a smaller sensor height have to be made according to a higher recording density, resulting in lift-off using CMP becoming difficult.

It is a feature of the present invention to provide a method for fabricating a magneto-resistive sensor which solves the aforementioned problems of the prior art and in which the height of the resist mask is sufficiently secured and lift-off can be easily carried out by using CMP.

The reason of a lower height of the resist mask is in the processes for etching the first stopper layer composed of DLC by RIE and for etching the magnetoresistive film by IBE. Herein, the former process is an unnecessary process in the typical process in which a lift-off technique using CMP is not used. If this process can be omitted, it would be possible to suppress the decrease of the height of the resist mask to the minimum.

The RIE process can be omitted by substituting the first stopper layer composed of DLC with a metallic material. That is, by removing the unnecessary part of the first stopper layer simultaneously with the magnetoresistive film by IBE using Ar ions, a decrease in the height of the resist mask can be suppressed to the minimum and lift-off using CMP becomes easier. Especially, in the case when a resist pattern with a small track width or sensor height is used, lift-off and elimination of the fence become possible.

According to a method for fabricating a magneto-resistive sensor of the present invention, elimination of the fence and lift-off becomes possible even if a resist pattern with a small track width or sensor height is used because lift-off using CMP can be carried out more easily. Therefore, a magneto-resistive sensor can be provided in which the track width and the sensor height are small, and contact failure does not arise between the upper shield layer and the magnetoresistive film. Moreover, by mounting a magneto-resistive sensor fabricated by a fabricating method of the present invention in a magnetic storage, a magnetic storage having a high recording density can be achieved.

BRIEF DESCRIPTION OF THE DRAWINGS

FIG. 9 is a schematic drawing illustrating a cross-section in the track width direction to explain a process for forming the track in a method for fabricating a CPP type magneto-resistive sensor of the embodiment 1-2.

FIG. 11 is a schematic drawing illustrating a cross-section of a magneto-resistive sensor in the sensor height direction in which a read sensor is mounted.

FIG. 24(a) is a schematic drawing illustrating a cross-section in the track width direction showing an example of a magneto-resistive sensor of the embodiment 3-1 or the embodiment 4-1, and FIG. 24(b) is a schematic drawing illustrating a cross-section in the track width direction showing an example of a magneto-resistive sensor of the embodiment 3-2 or the embodiment 4-3.

FIG. 29(a) is a schematic drawing illustrating a cross-section in the track width direction showing an example of a magneto-resistive sensor of the embodiment 4-2, and FIG. 29(b) is a schematic drawing illustrating a cross-section in the track width direction showing an example of a magneto-resistive sensor of the embodiment 4-4.

DETAILED DESCRIPTION OF THE INVENTION

Figure 5:
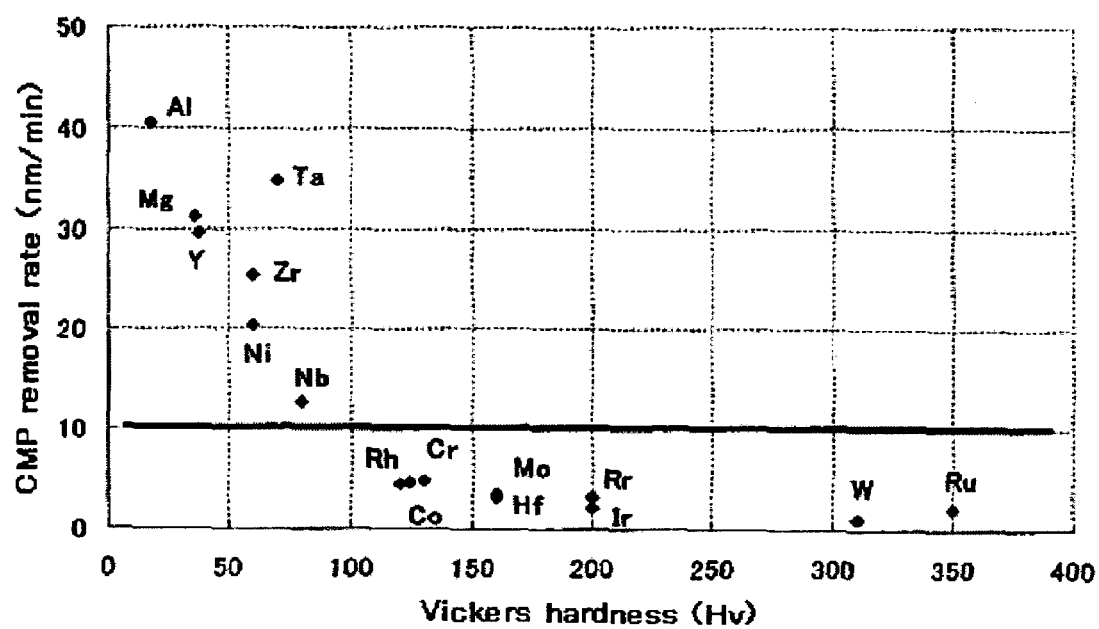
FIG. 5 is a graph showing a relationship between CMP polishing rate and Vickers hardness.

In the case when a metallic material is used for the first stopper layer, whether the metal will work as a stopper layer in CMP becomes a problem. The polishing rate by CMP is required to be low to function as a stopper layer in CMP. Generally, the CMP polishing rate depends on the hardness of the material. Table 1 shows polishing rates and Vickers hardness of typical materials when the down force (applying weight) is 6 psi. It is preferable that the thickness of the stopper layer is as small as possible and is about 10 nm or less in order to shorten the etching time while simultaneous etching with the magnetoresistive film by an IBE technique. Therefore, considering that the actual polishing time is about 60 seconds, it is appropriate that a material in which the polishing rate is less than 10 nm/min is used. As mentioned above, it is understood for the first stopper layer that a metallic material which has a Vickers hardness at least greater than 80 Hv or an alloy material including the metallic material is preferably used for the stopper layer because the polishing rate depends on the hardness of the material. The relationship between the CMP polishing rate and the Vickers hardness shown in FIG. 5 indicates that one metallic material selected from the group of Co, Cr, Mo, Hf, Ir, Nb, Re, Rh, Ru, and W or an alloy including them concretely becomes a candidate.

TABLE 1

| | Al | Co | Cr | Hf | Ir | Ni | Mg | Mo |
|---|---|---|---|---|---|---|---|---|
| CMP removal rate (nm/min) | 40.5 | 4.6 | 4.8 | 3.3 | 2.1 | 20.4 | 31.2 | 3.5 |
| Vickers hardness (Hv) | 18 | 124 | 130 | 160 | 200 | 60 | 36 | 160 |

| | Nb | Re | Rh | Ru | Ta | W | Y | Zr |
|---|---|---|---|---|---|---|---|---|
| CMP removal rate (nm/min) | 12.8 | 3.3 | 4.4 | 2.2 | 34.8 | 1.1 | 29.6 | 25.5 |
| Vickers hardness (Hv) | 80 | 200 | 120 | 350 | 70 | 310 | 38 | 60 |

Next, the advantages of using these metallic materials are verified compared with using DLC for the first stopper layer.

When the first stopper layer composed of DLC is etched by using RIE, the height of the resist mask is reduced as mentioned above. For instance, the etching rates of DLC and the resist mask are 58 nm/min and 420 nm/min, respectively, under the condition of a gas flow rate of 10 sccm, a gas pressure of 1.0 Pa, a power of 200 W, and a bias of 100 W. When the thickness of the first stopper layer composed of DLC is made to be 10 nm, the etching time becomes 10 seconds but the height of the resist mask will decrease by 70 nm during etching.

On the other hand, in the case when the first stopper layer is composed of a metallic material and etched with the magnetoresistive film by using IBE, the etching time by using IBE is extended by the time for etching the first stopper layer. For instance, in the case when Rh is used for the first stopper layer with a thickness of 10 nm and etching is carried out under the condition of an acceleration voltage of 200 V, an ion current of 0.10 A, an RF output of 400 W, an IBE angle of 10 degrees, the etching time for the first stopper layer is about 2 minutes 20 seconds, which means that the etching time is extended by this amount of time. The etching rate for the resist mask under this condition was 6 nm/min, so that about 26 nm of the height of the resist mask is decreased by this extended etching time. According to the investigation mentioned above, making the first stopper layer of a metallic material can suppress the reduction of the height of the resist mask to about 44 nm, it makes lift-off by CMP easy, and it avoids remaining lift-off of the resist mask and remaining removal of the fence, such that it can be said that it is possible to establish a process for obtaining a higher yield.

Figure 6:
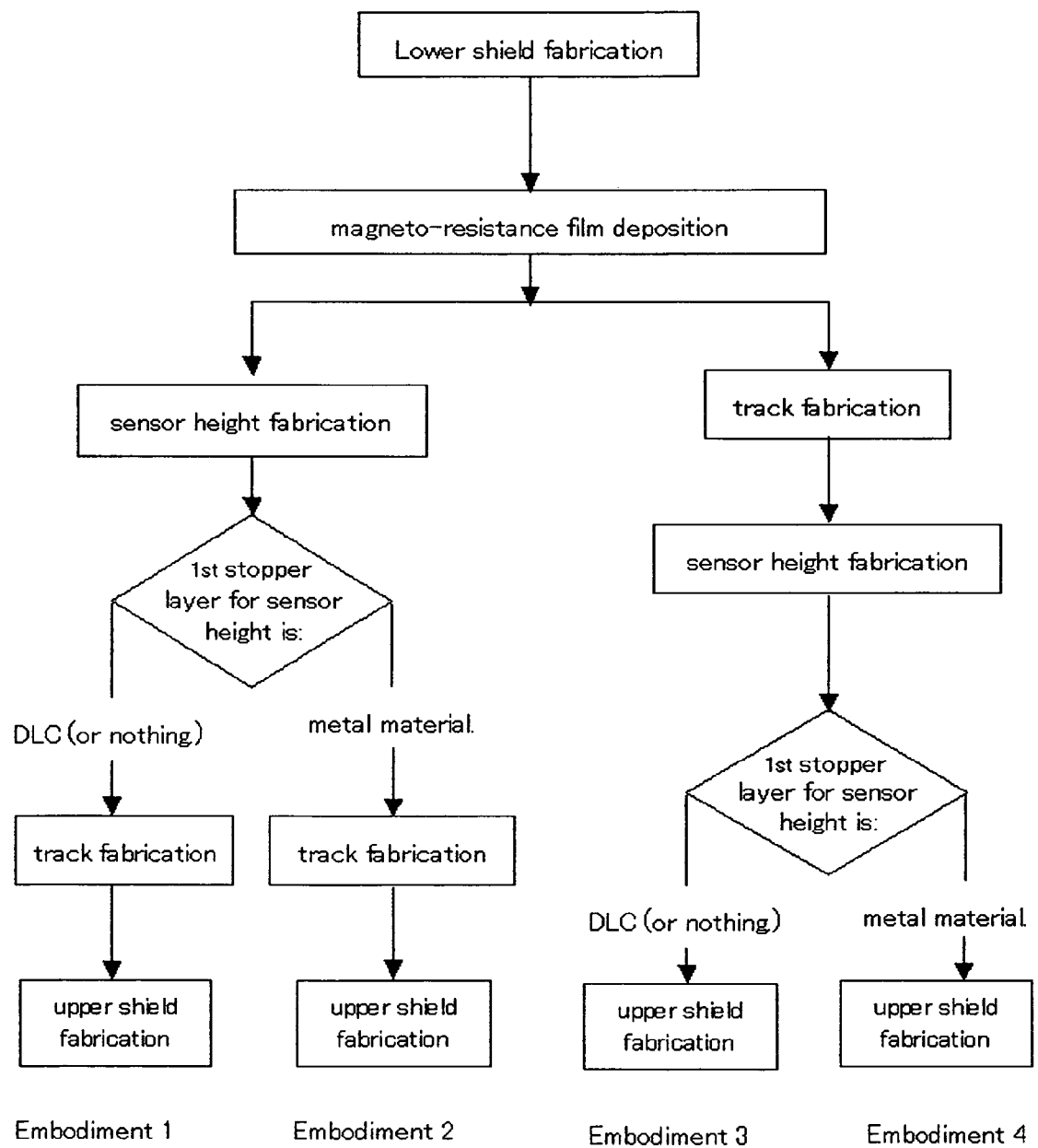
FIG. 6 is a flow chart of a process for fabricating a CPP type magneto-resistive sensor.

Next, the embodiments of the present invention will be explained below using drawings. FIG. 6 is a process flow drawing illustrating a method for fabricating a read sensor of the present invention.

As shown in FIG. 6, the embodiments 1 and 2 will describe the case when the sensor height of the magnetoresistive film is formed prior to the formation of track. The embodiment 1 will describe the case when DLC is used for the first stopper layer 41 (also referred to as "first stopper layer for sensor height 41") described below or when the sensor height is formed without providing the first stopper layer for sensor height 41 during the formation of sensor height. The embodiment 2 will describe the case when a metallic material is used for the first stopper layer for sensor height and the sensor height is formed.

Furthermore, the embodiments 3 and 4 will describe the cases when the track of the magnetoresistive film is formed prior to the formation of the sensor height. Herein, the embodiment 3 will describe the case when DLC is used for the first stopper layer for sensor height 41 or when the sensor height is formed without providing the first stopper layer for sensor height 41. The embodiment 4 will describe the case when a metallic material is used for the first stopper layer for sensor height and the sensor height is formed.

EMBODIMENT 1

Figure 7:
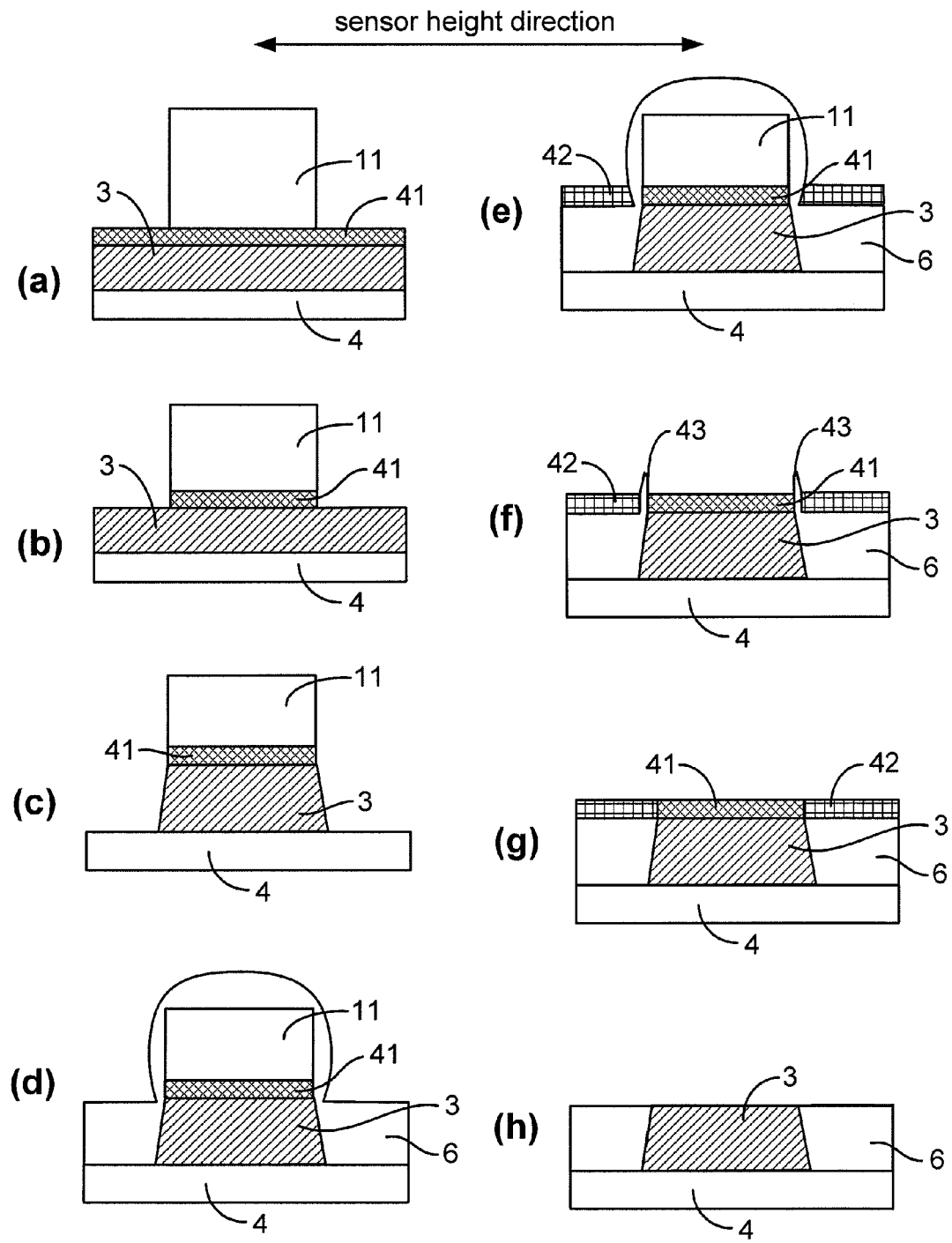
FIG. 7 is a schematic drawing illustrating a cross-section in the sensor height direction to explain a process for forming the sensor height in a method for fabricating a CPP type magneto-resistive sensor of the embodiment 1.
Figure 8:
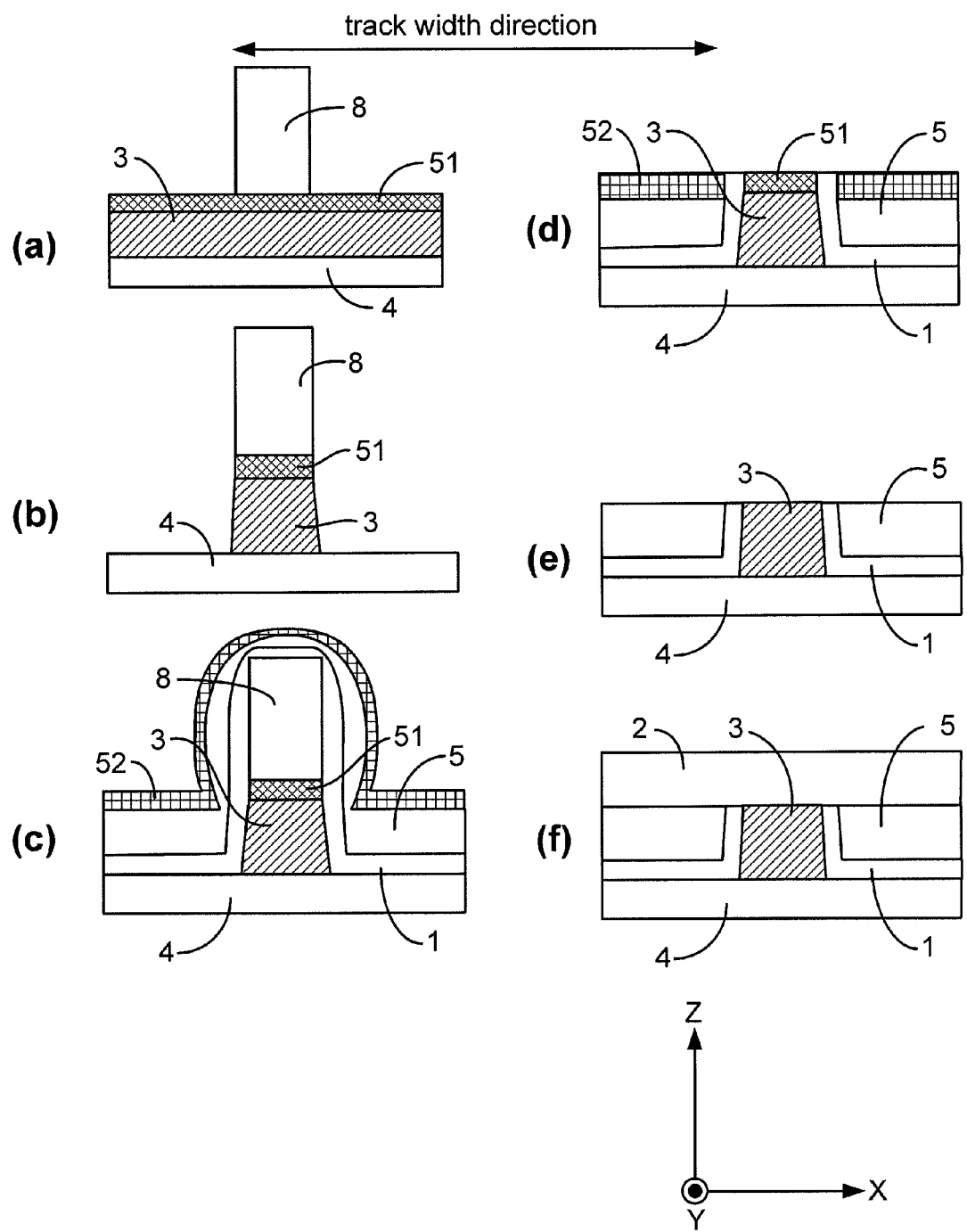
FIG. 8 is a schematic drawing illustrating a cross-section in the track width direction to explain a process for forming the track in a method for fabricating a CPP type magneto-resistive sensor of the embodiment 1-1.

A method for fabricating a magneto-resistive sensor will be described as an example of the present invention using FIGS. 7, 8, and 9. FIG. 7 is cross-sectional drawings in the sensor height direction at a position where a magnetoresistive film 3 is placed that shows the formation process in the sensor height direction. FIGS. 8 and 9 are cross-sectional drawings in the track width direction at a position where a magnetoresistive film 3 is placed that show the formation processes of the track. These embodiments are separated into the case when the first stopper layer for track 51 is removed (embodiment 1-1) and the case when it is not removed (embodiment 1-2) as will be explained later. FIG. 8 shows the process for forming the track described in the embodiment 1-1, and FIG. 9 shows the process for forming the track described in embodiment 1-2.

At first, an insulator such as $Al_2O_3$ etc. is deposited on the surface of a substrate composed of alumina titanium carbide, etc. and the lower shield layer 4 is formed after applying precision polishing by using CMP. It is formed by patterning into a predetermined shape a film composed of a Ni—Fe based alloy deposited by using, for instance, sputtering, ion beam sputtering, or plating. This lower shield layer 4 also works as a lower electrode. By growing $Al_2O_3$ on top of this and applying CMP, the surface of the substrate becomes a surface where the lower shield layer 4 and $Al_2O_3$ are planarized. Moreover, an extraction electrode film is formed at the part separated from the place where the magnetoresistive film is formed in the following process. This consists of a laminated film of, for instance, Ta and Au, etc.

The magnetoresistive film 3 is formed on the lower shield layer 4 by using, for instance, sputtering and ion beam sputtering. The magnetoresistive film consists of a pinned layer composed of a layer including, for instance, a Co—Fe based alloy a ferromagnetic, an intermediate layer composed of an Al—O or Cu, etc., and a free layer composed of a layer including a Ni—Fe based alloy or a Co—Fe based alloy, etc.

Next, formation in the sensor height direction is carried out. Hereafter, a formation process in the sensor height direction will be explained using FIG. 7.

At first, the first stopper layer for sensor height 41 is deposited on the magnetoresistive film 3. This first stopper layer for sensor height 41 is formed by depositing DLC using ion beam sputtering or a CVD technique. Next, a resist is coated on the magnetoresistive film 3, exposed by using a stepper, and patterned into a desired shape by developing using a developer to make the resist mask 11 (FIG. 7(a)).

Next, RIE is carried out for the first stopper layer for sensor height 41 and the region of the first stopper layer for sensor height 41 is removed except for the read element (FIG. 7(b)). Next, dry-etching such as IBE and RIE, etc. is carried out for the magnetoresistive film 3 to form a pattern in the sensor height direction (FIG. 7(c)). In the case when IBE is used for etching, it is preferable that the ion beam etching is carried out again with the second incidence angle tilted greater than the first incidence angle for etching against the substrate. This process makes it possible to remove the redepositions deposited on the sensor wall during the first etching. Moreover, the redepositions deposited on the sensor wall can be removed by a plurality of repetition of alternating the first etching and the second etching. Moreover, different etching techniques may be used for the first etching and the second etching.

Next, the refill film along sensor height direction 6 is deposited by using sputtering, ion beam sputtering, or a CVD technique (FIG. 7(d)). At least the part of the refill film along sensor height direction 6 connected to the magnetoresistive film 3 is formed of an insulator material such as Al oxide or Si oxide. Next, in order to protect the refill film along sensor height direction 6, the second stopper layer for sensor height 42 is deposited (FIG. 7(e)). The second stopper layer for sensor height 42 is formed by depositing DLC using ion beam sputtering or a CVD technique.

Then, lift-off is carried out. First, the resist mask 11 is removed using an organic solvent (FIG. 7(f)). At this time, there is a situation where a fence 43 is created as shown in FIG. 7(f) or the resist mask 11 not completely removed, but these are removed by CMP applied in the next step. The process for removing the resist mask using an organic solvent may be omitted. Next, CMP is applied and the fence 43 or the resist mask 11 which has not been removed is removed (FIG. 7(g)). Finally, the formation in the sensor height direction is completed by removing the first stopper layer for sensor height 41 and the second stopper layer for sensor height 42 by using RIE (FIG. 7(h)).

Herein, a method for forming the sensor height direction applying a lift-off technique by CMP using DLC is described, and a process for removing the resist mask 11 using an organic solvent may be only carried out without providing the first stopper layer for sensor height 41 and the second stopper layer for sensor height 42.

After this process, the track width direction is formed. Hereafter, a method for forming the track width direction will be explained using FIGS. 8 and 9. FIG. 8 is process flow drawings of the embodiment 1-1 in which the first stopper layer 51 (also referred to as "first stopper layer for track 51") is removed. FIG. 9 is process flow drawings of the embodiment 1-2 in which the first stopper layer for track 51 is not removed.

First, the first stopper layer for track 51 is deposited on the magnetoresistive film 3. This first stopper layer for track 51 is formed by depositing a metallic material using sputtering, ion beam sputtering or a CVD technique. As mentioned above, a material which has a lower polishing rate by CMP, that is, one which has a high hardness, is suitable for the first stopper layer for track 51 for functioning as a stopper for CMP. The thickness of the first stopper layer for track 51 is preferably as thin as possible, about 10 nm or less, in order to shorten the etching time while simultaneously etching with the magnetoresistive film by IBE using Ar ions in the following process. Therefore, considering that the actual polishing time is about 60 seconds, it is appropriate that a material having a polishing rate less than 10 nm/min be used and it is necessary that it be composed of a metallic material, which has a Vickers hardness at least greater than about 80 Hv, selected from Table 1 and FIG. 5. A metallic material selected from a group of Co, Cr, Mo, Hf, Ir, Nb, Re, Rh, Ru, and W or an alloy including these materials can be used as a definite material.

Next, a resist is coated on the first stopper layer for track 51, exposed by using a stepper, and patterned into a desired shape by developing using a developer to make the resist mask 8 (FIG. 8(a) or FIG. 9(a)). The length of the resist mask 8 in the sensor height direction is made to be longer than the length of the resist mask 11 in the sensor height direction for forming the sensor height. Thereby, in the vicinity of the magnetoresistive film 3 in the sensor height direction the refill film along sensor height direction is prevented from polishing by CMP in the following lift-off process. As a result, the prevention of leakage of sense current can be expected.

Next, dry-etching by using IBE or RIE is carried out for the magnetoresistive film 3 and the first stopper layer for track 51 to form a pattern in the track width direction by etching (FIG. 8(b) or FIG. 9(b)). In the case when IBE is used, it is possible to apply an etching in which the incident angle is changed during etching. In this case, it is preferable that the etching is carried out again with the second incidence angle tilted greater than the first incidence angle for etching against the substrate. This process makes it possible to remove the redepositions deposited on the sensor wall during the first etching. Moreover, one may perform a plurality of repetition of alternating first etching and second etching. Furthermore, different etching techniques may be used for the first etching and the second etching.

Next, the refill film along track width direction 1, the longitudinal bias layer or side shield layer 5, and the second stopper layer for track 52 are deposited in order (FIG. 8(c) or FIG. 9(c)). At least the part of the refill film along track width direction 1 connected to the magnetoresistive film 3 is formed of an insulator material such as Al oxide or Si oxide. There may not be a longitudinal bias layer or side shield layer 5. The second stopper layer for track 52 is the one to protect the refill film along track width direction 1 and the longitudinal bias layer or side shield layer 5, and is composed of DLC or the same metallic material as the first stopper layer for track 51 described above.

Then, lift-off is carried out. First, the resist mask 8 is removed by CMP (FIG. 8(d) or FIG. 9(d)). At this time, the resist mask 8 except for the read element may be removed beforehand using an organic solvent. In the embodiment 1-1, the first stopper layer for track 51 and the second stopper layer for track 52 are removed by etching (FIG. 8(e)). As described in the embodiment 1-2, there is no problem if the first stopper layer for track 51 is not removed. In this case, the shape shown in FIG. 9(e) can be obtained. In the case when the first stopper layer for track 51 is not removed, it should be considered that the resistance of the first stopper layer for track 51 becomes extra resistance which has no relation in changing the magnetoresistance. That is, it is preferable that the first stopper layer for track 51 be composed of a noble metal (concretely, Rh, Ir, and Ru) or an alloy including them which has a low resistance, selected from the metallic materials which may be the first stopper layer for track 51 mentioned above.

When 20,000 elements having the track width of 50 nm were manufactured by using 10 nm thick Rh for the first stopper layer for track 51 and a 10 nm thick DLC for the second stopper layer for track 52 in the actual formation in the track width direction, lift-off was possible for all elements and there was no fence.

After this process, the upper shield layer 2 composed of a soft magnetic material is formed on top of the magnetoresistive film 3 (FIG. 8(f) or FIG. 9(f)). This upper shield layer also works as an upper electrode. When this upper shield layer 2 is formed, it may be possible that a metallic material such as Ta and NiCr, etc. is deposited on top of the magnetoresistive film 3 as an underlayer and then the upper shield layer 2 is formed.

Figure 1:
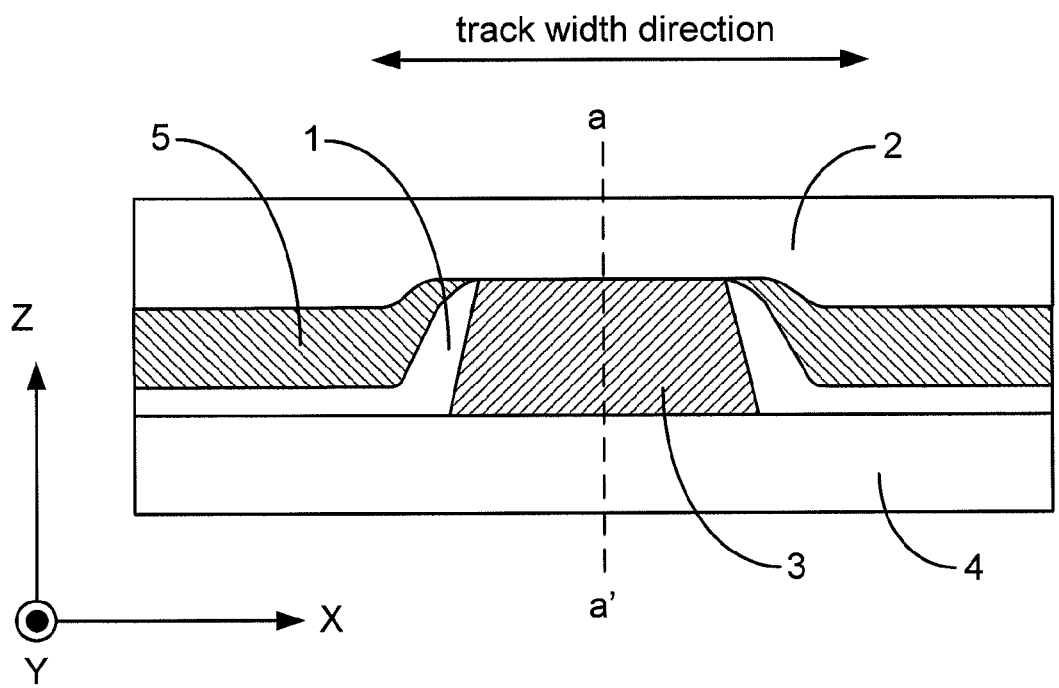
FIG. 1 is a schematic drawing illustrating a cross-section of a CPP type magneto-resistive sensor in the track width direction.
Figure 2:
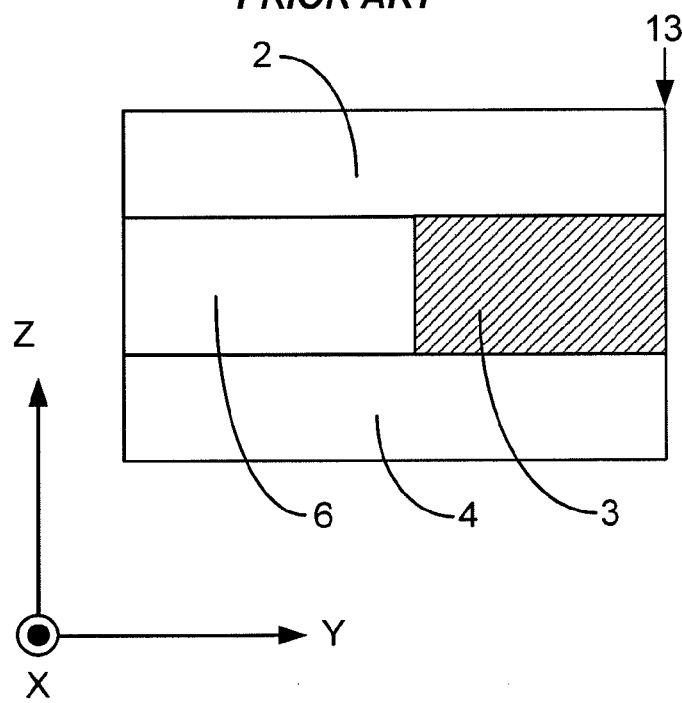
FIG. 2 is a schematic drawing illustrating a cross-section of a CPP type magneto-resistive sensor in the sensor height direction.
Figure 3:
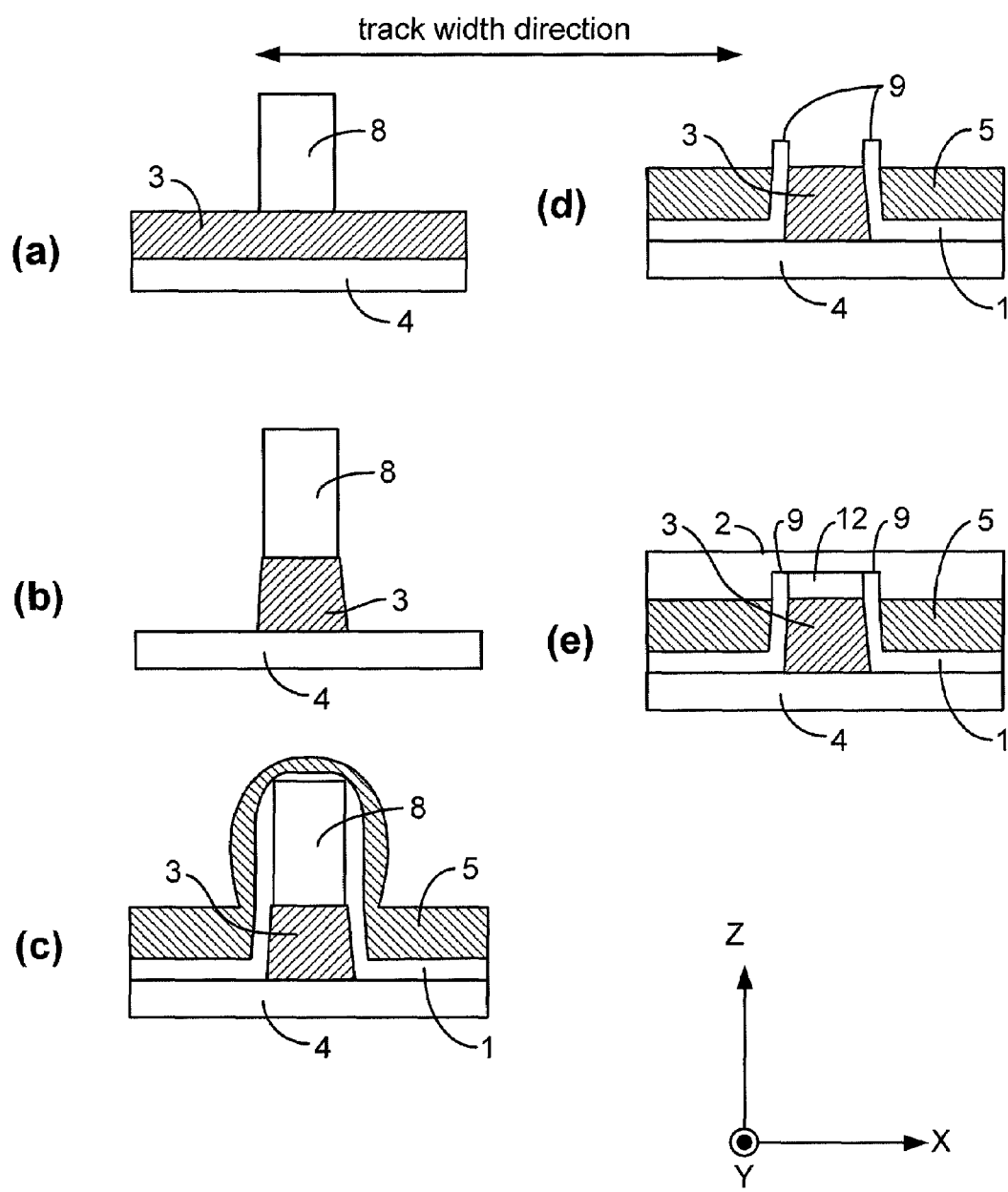
FIG. 3 is a schematic drawing illustrating a cross-section in the track width direction showing a process for forming a conventional magneto-resistive sensor in the track width direction.
Figure 4:
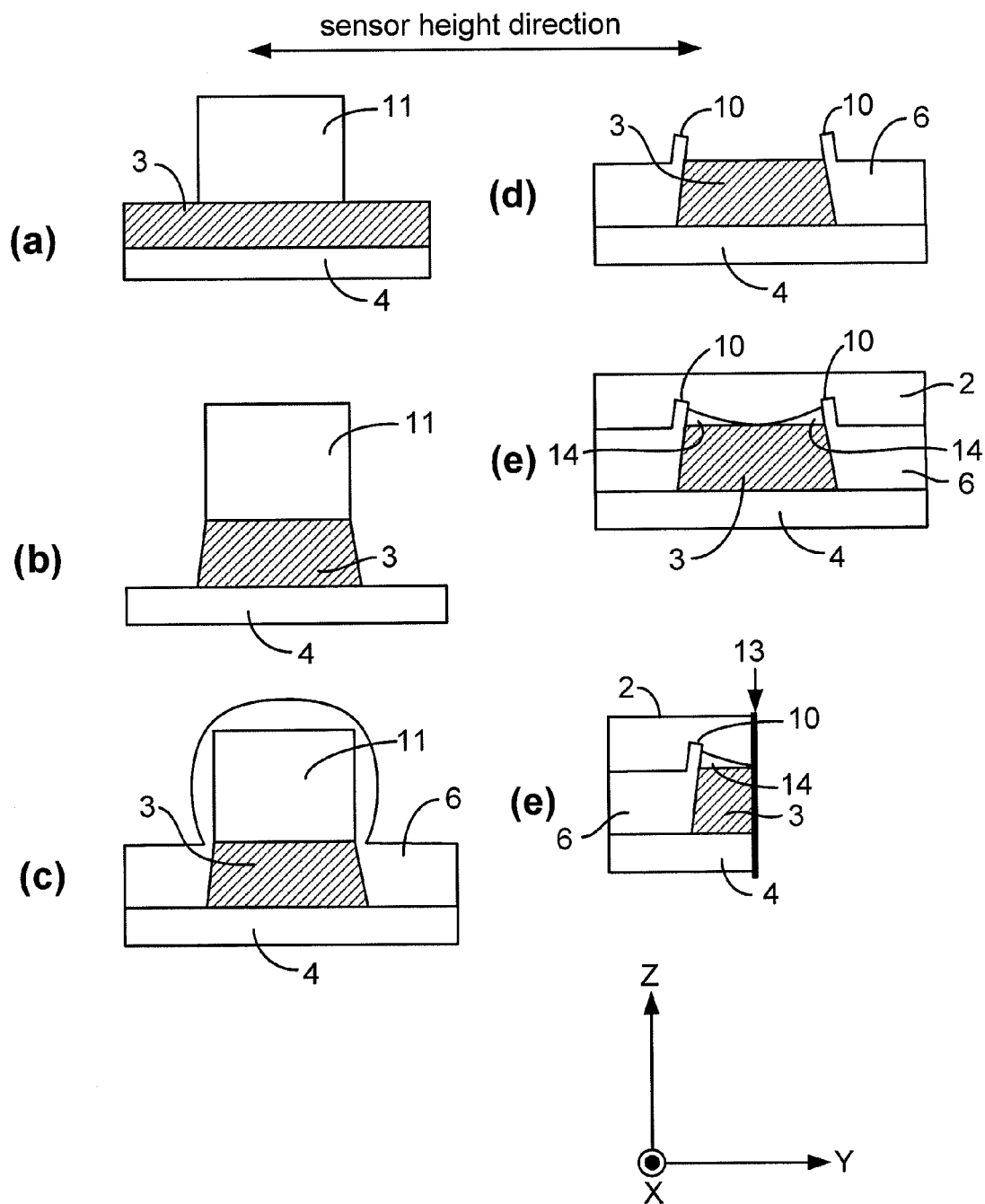
FIG. 4 is a schematic drawing illustrating a cross-section in the sensor height direction showing a process for forming a conventional magneto-resistive sensor in the sensor height direction.

In the case when the first stopper layer for track 51 is removed as described in the embodiment 1-1 (in the case when the process shown in FIG. 8 is used for track formation), the cross-sectional configuration of the magneto-resistive sensor in the track width direction becomes the one shown in FIG. 8(f) and the cross-sectional configuration of the magneto-resistive sensor in the sensor height direction becomes the same as the one shown in FIG. 2.

Figure 10:
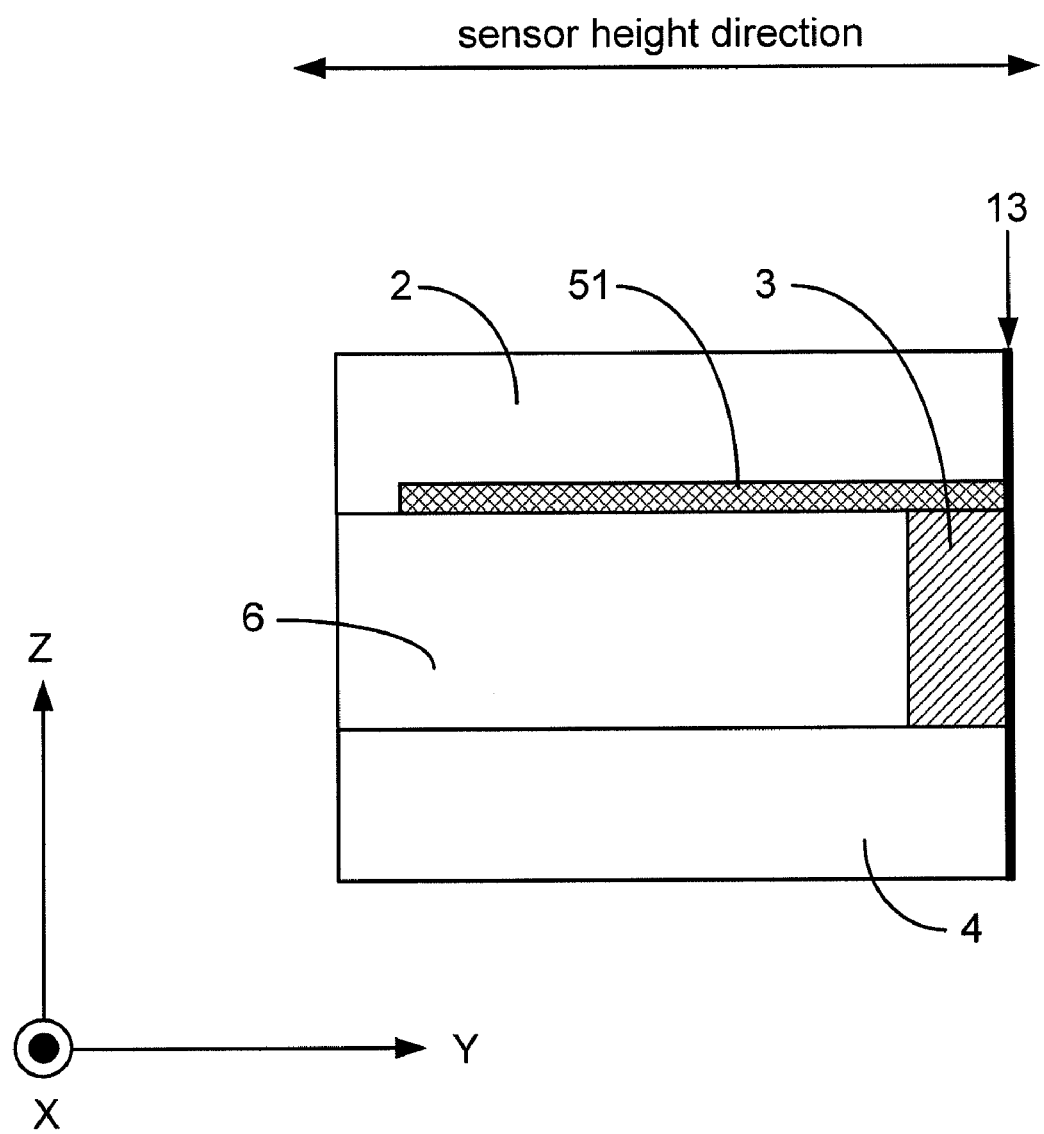
FIG. 10 is a schematic drawing illustrating a cross-section in the sensor height direction showing an example of a magneto-resistive sensor of the embodiment 1.

On the other hand, in the case when the first stopper layer for track 51 is not removed as described in the embodiment 1-2 (in the case when the process shown in FIG. 9 is used for track formation), the cross-sectional configuration of the magneto-resistive sensor in the track width direction becomes the one shown in FIG. 9(f) and the cross-sectional configuration of the magneto-resistive sensor in the sensor height direction becomes the same as the one shown in FIG. 10. Thus, especially in the case when the sensor height of the magnetoresistive film 3 is small, it is expected that the contact resistance between the magnetoresistive film 3 and the upper shield layer 2 is decreased by the first stopper layer for track 51 remaining.

After this, the magneto-resistive sensor of the present invention can be obtained by forming the air bearing surface 13 by the slider formation process after passing the process for forming terminals or the process for forming a write sensor for recording information in a medium. FIG. 11 is a cross-sectional drawing in the sensor height direction illustrating a magneto-resistive sensor in which a write sensor is provided. In the case of longitudinal recording, a write sensor consists of a lower pole 18, an upper pole 19, a coil 20, a coil insulator 21, a recording gap 22, and an upper yoke 31 as shown in FIG. 11(a). Moreover, in the case of a perpendicular magnetic storage, a write sensor consists of an adjunct pole 23, a main pole 24, a coil 20, and a coil insulator 21 as shown in FIG. 11(b).

Figure 12:
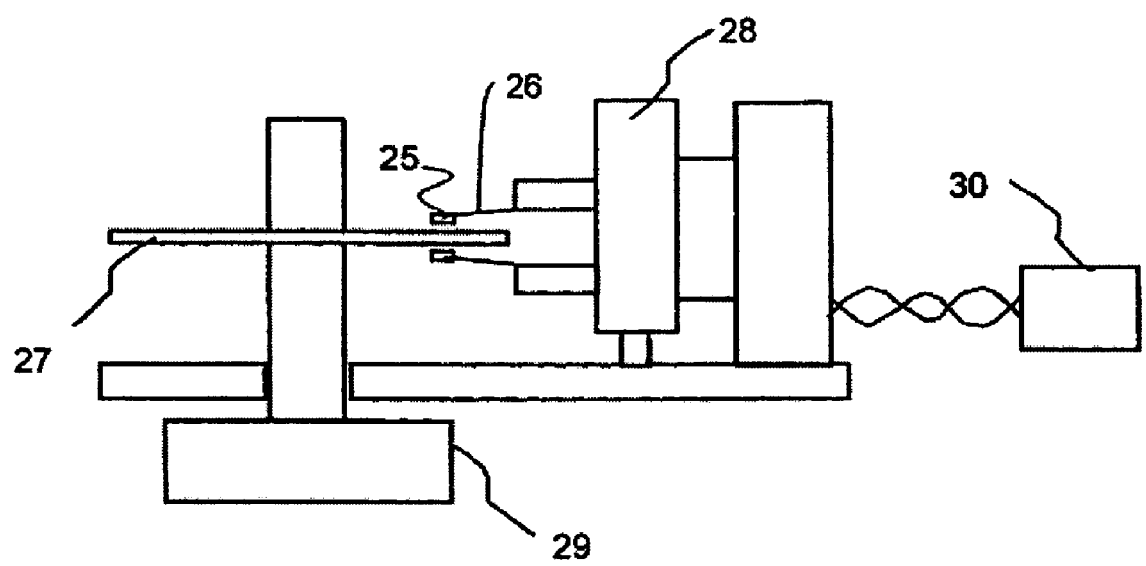
FIG. 12 is a schematic drawing illustrating a magnetic storage in which a magneto-resistive sensor of the present invention is mounted.

Furthermore, it is possible to fabricate a magnetic storage by mounting the magneto-resistive sensor 25 of the present invention at the tip of the gimbals 26, and by providing a recording medium 27, a voice coil motor 28, a spindle 29, and a signal processing circuit 30 as shown in FIG. 12.

Although the present invention as described in detail above with reference to the magnetoresistive film 3 was explained using one which consists of a pinned layer composed of a layer including a Co—Fe based alloy ferromagnetic, an intermediate layer composed of Al—O or Cu, etc., and a free layer composed of a layer including a Ni—Fe based alloy or a Co—Fe based alloy, these are specific examples and the present invention is not limited to these examples. Besides this structure, the effects of the present invention are not changed by reasonable variations and modifications of the devices which carry a detection current nearly in the direction perpendicular to the film surface of the material constituting the magnetoresistive film such as, for instance, a magnetoresistive film using a high polarizability material for the pinned layer or the free layer, a magnetoresistive film providing a current screen layer in the pinned layer, intermediate layer, and the free layer, a magneto-resistive sensor using a magnetic semiconductor, and a magneto-resistive sensor using a diffusion and accumulation phenomena of the polarized spin.

Moreover, although the aforementioned examples described a magneto-resistive sensor in which the magnetoresistive film 3 is arranged so as to be exposed to the air bearing surface 13, the same effects can be obtained in a magneto-resistive sensor in which a part of the magnetoresistive film 3 is arranged to be exposed to the air bearing surface and a magneto-resistive sensor in which the magnetoresistive film 3 is arranged separated from the air bearing surface.

Moreover, although the aforementioned examples described a method for fabricating a CPP type magneto-resistive sensor, the same method can be employed for fabricating a CIP type magneto-resistive sensor. In this case, an insulator layer has to be placed between the magnetoresistive film 3, the lower shield layer 4, and the upper shield layer 3. Moreover, the refill film along track width direction 1 is not necessary, and a longitudinal bias layer or side shield layer 5, which also works as an electrode, becomes necessary.

EMBODIMENT 2

The embodiment 1 described the case when the first stopper layer for sensor height 41 was not used during formation in the sensor height direction or when it was formed using DLC. However, in the case when it is necessary to make the length of the resist mask 11 smaller in the sensor height direction, a fabricating method described as follows becomes necessary. A method for fabricating a magneto-resistive sensor of this embodiment will be described with reference to the following drawings herein.

This embodiment can be divided into a total of four cases; the case when the first stopper layer for sensor height 41 is removed in the formation process of the sensor height, and the case when not removed; the case when the first stopper layer for track 51 is removed in the formation process of the track, and the case when not removed. Hereafter, the explanation will be carried out as follows; the case when both the first stopper layer for sensor height 41 and the first stopper layer for track 51 are removed is assumed to be the embodiment 2-1; the case when the first stopper layer for sensor height 41 is removed and the first stopper layer for track 51 is not removed is assumed to be the embodiment 2-2; the case when the first stopper layer for sensor height 41 is not removed and the first stopper layer for track 51 is removed is assumed to be the embodiment 2-3; and the case when neither the first stopper layer for sensor height 41 nor the first stopper layer for track 41 is removed is assumed to be the embodiment 2-4.

Figure 13:
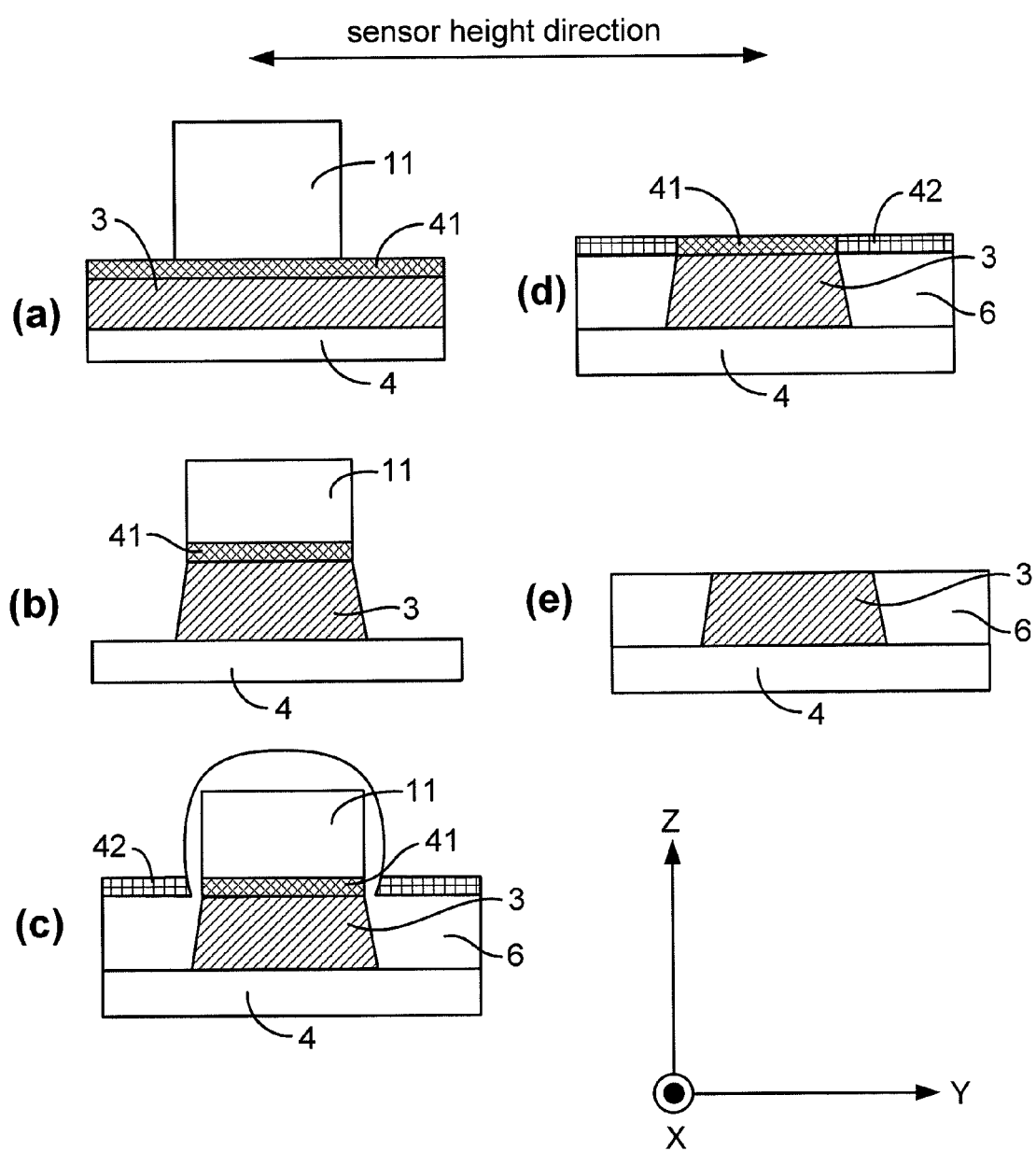
FIG. 13 is a schematic drawing illustrating a cross-section in the sensor height direction to explain a process for forming the sensor height in a method for fabricating a CPP type magneto-resistive sensor of the embodiments 2-1 and 2-2.
Figure 14:
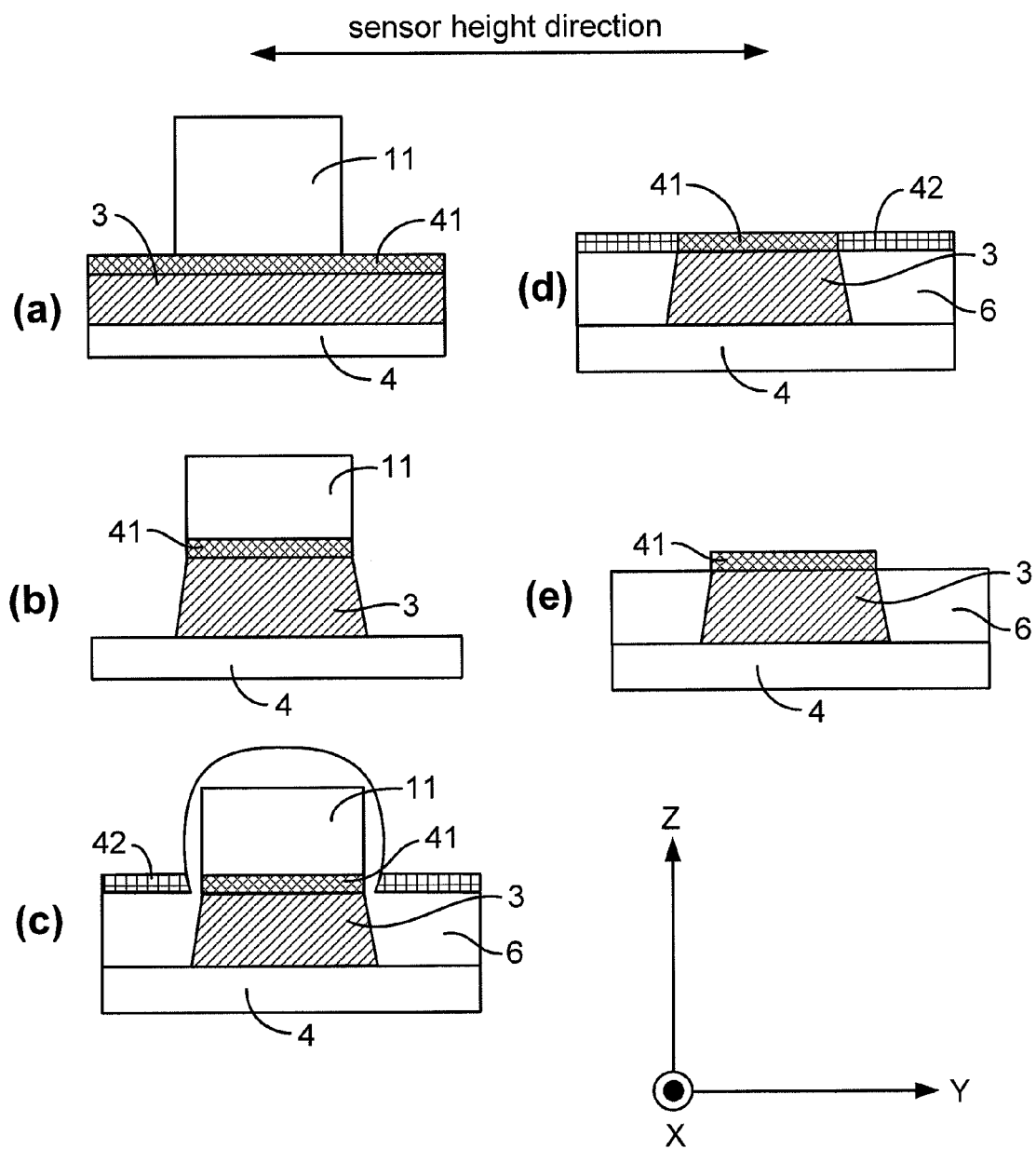
FIG. 14 is a schematic drawing illustrating a cross-section in the sensor height direction to explain a process for forming the sensor height in a method for fabricating a CPP type magneto-resistive sensor of the embodiments 2-3 and 2-4.
Figure 15:
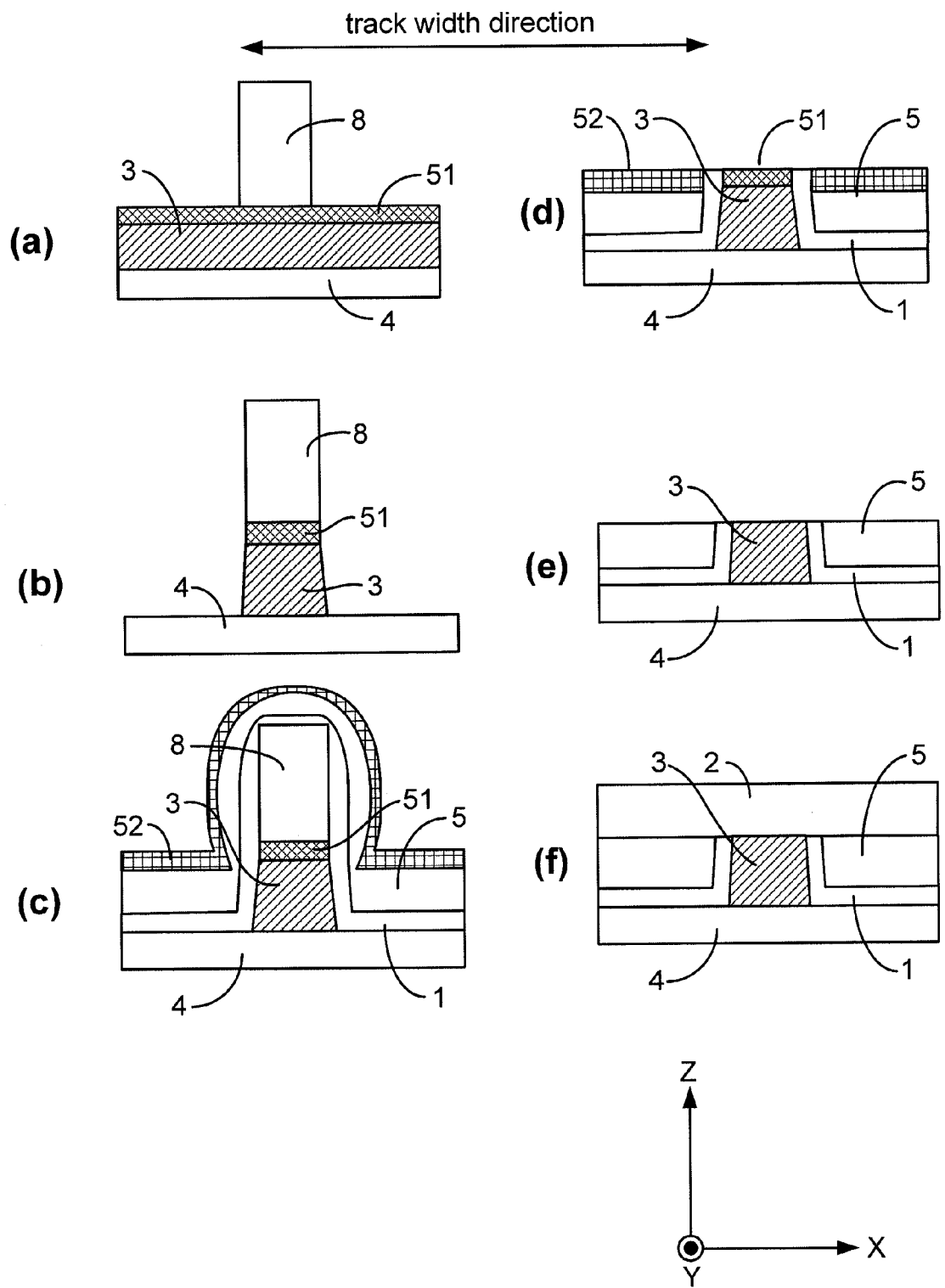
FIG. 15 is a schematic drawing illustrating a cross-section in the track width direction to explain a process for forming the track in a method for fabricating a CPP type magneto-resistive sensor of the embodiment 2-1.
Figure 16:
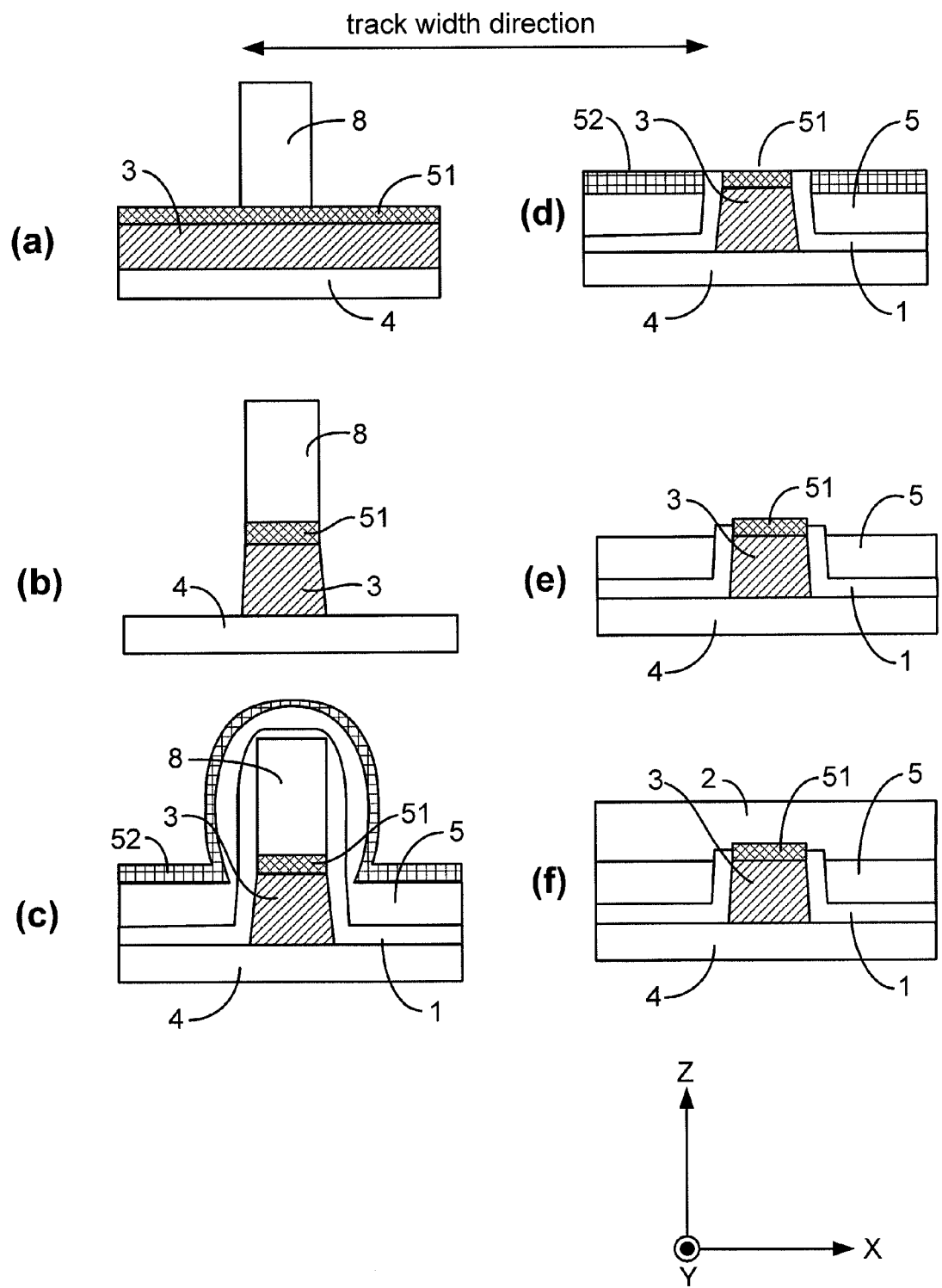
FIG. 16 is a schematic drawing illustrating a cross-section in the track width direction to explain a process for forming the track in a method for fabricating a CPP type magneto-resistive sensor of the embodiment 2-2.
Figure 17:
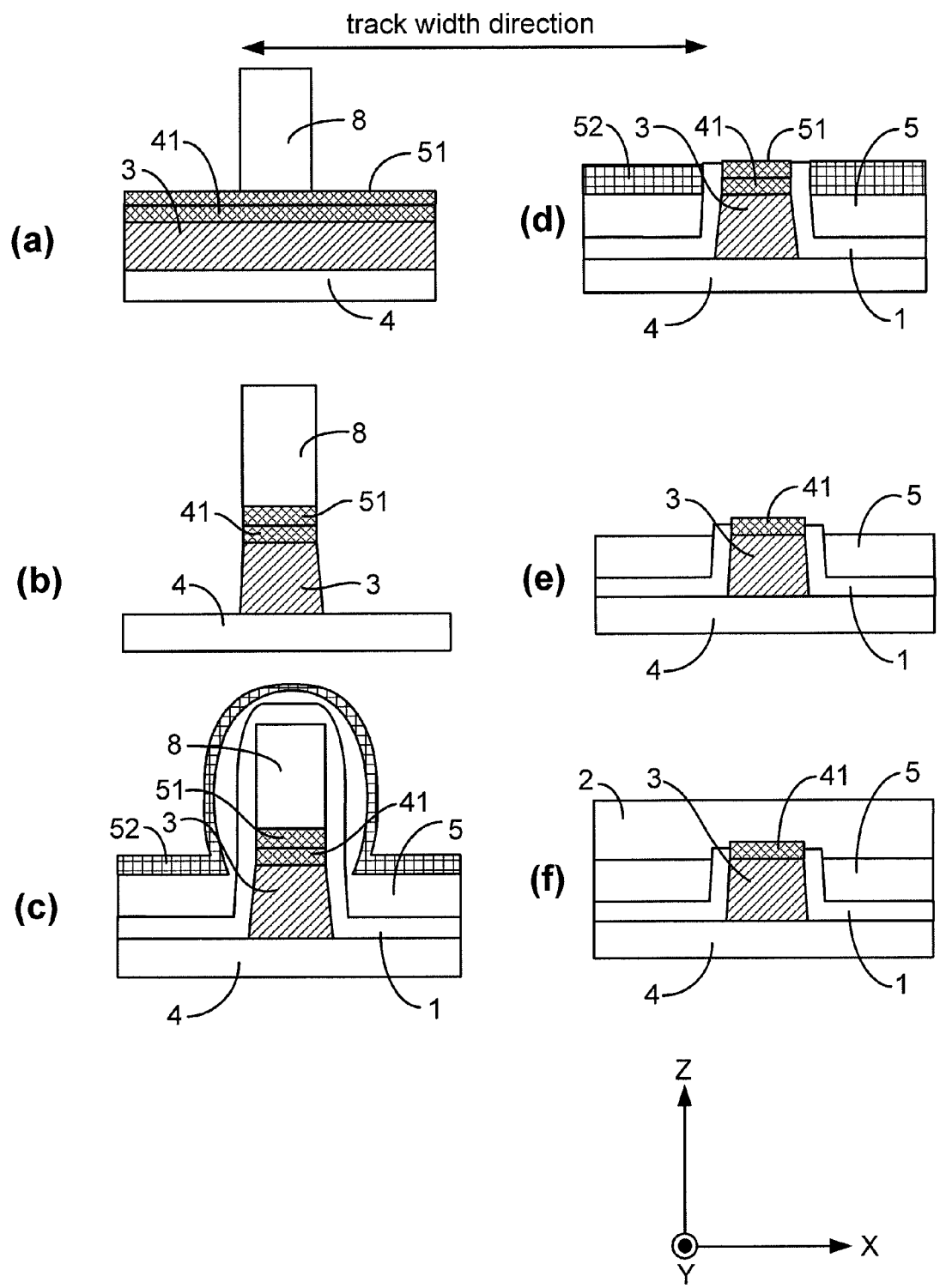
FIG. 17 is a schematic drawing illustrating a cross-section in the track width direction to explain a process for forming the track in a method for fabricating a CPP type magneto-resistive sensor of the embodiment 2-3.
Figure 18:
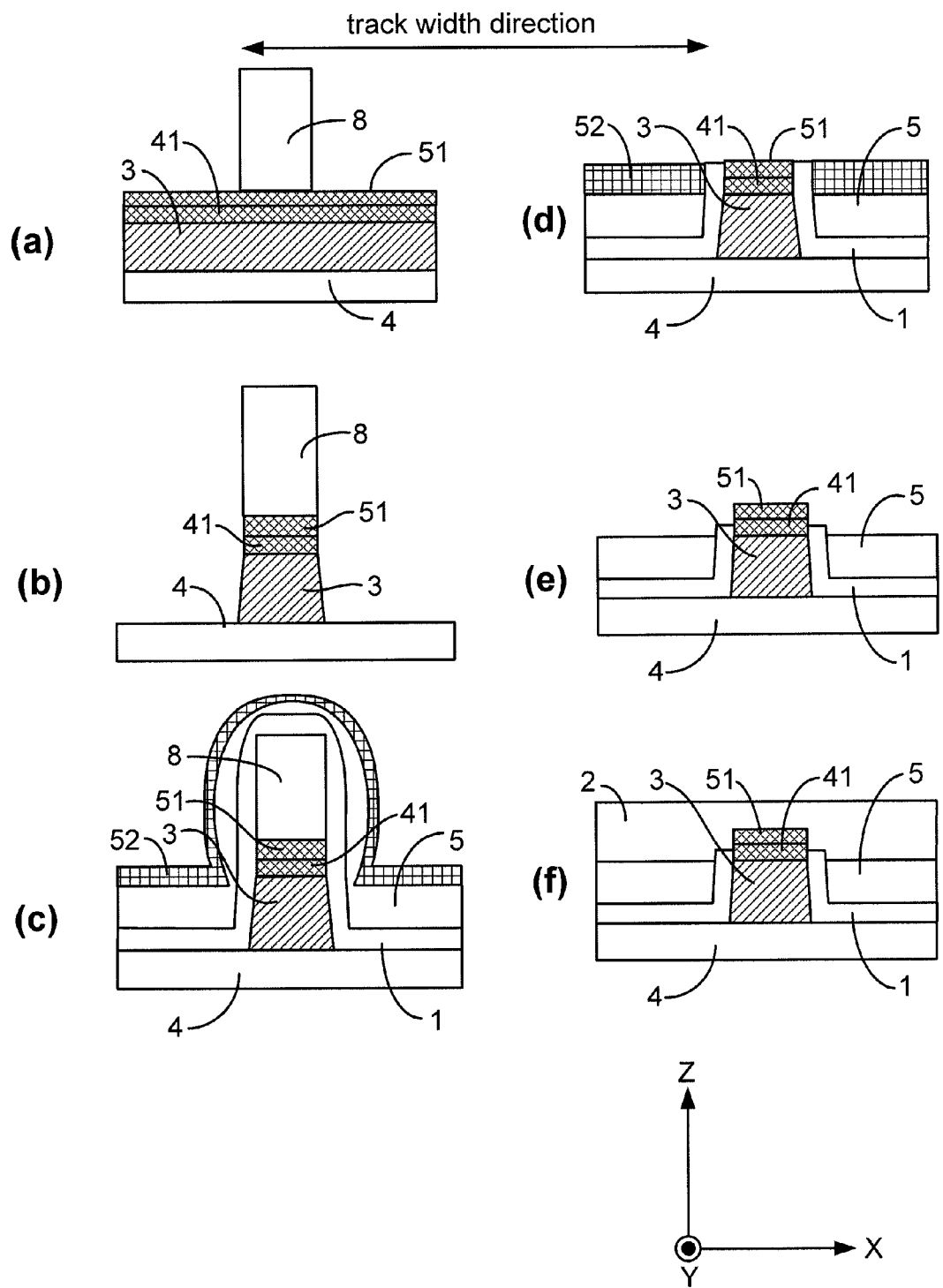
FIG. 18 is a schematic drawing illustrating a cross-section in the track width direction to explain a process for forming the track in a method for fabricating a CPP type magneto-resistive sensor of the embodiment 2-4.

FIGS. 13 and 14 are cross-sectional drawings in the sensor height direction at the point where the magnetoresistive film 3 is placed that shows the formation process in the sensor height direction. FIG. 13 shows the case when the stopper layer for sensor height 41 is removed (the embodiments 2-1 and 2-2) and FIG. 14 shows the case when it is not removed (the embodiments 2-3 and 2-4). FIGS. 15 to 18 are cross-sectional drawings in the track width direction at the point where the magnetoresistive film 3 is placed that shows the formation process of the track in this embodiment. FIGS. 15, 16, 17, and 18 correspond to embodiment 2-1, embodiment 2-2, embodiment 2-3, and embodiment 2-4, respectively.

At first, an insulator such as $Al_2O_3$, etc. is deposited on the surface of a substrate composed of alumina titanium carbide, etc. and the lower shield layer 4 is formed after applying precision polishing using CMP. It is formed by patterning into a predetermined shape a film composed of a Ni—Fe based alloy deposited by using, for instance, sputtering, ion beam sputtering, or plating. This lower shield layer 4 also works as a lower electrode. By growing $Al_2O_3$ on top of this and applying CMP, the surface of the substrate becomes a surface where the lower shield layer 3 and $Al_2O_3$ are planarized. Moreover, an extraction electrode film is formed at the part separated from the place where the magnetoresistive film 3 is formed in the following process. This consists of a laminated film of, for instance, Ta and Au, etc.

The magnetoresistive film 3 is formed on the lower shield layer 4 by using, for instance, sputtering and ion beam sputtering. The magnetoresistive film consists of a pinned layer composed of a layer including, for instance, a Co—Fe based alloy ferromagnetic, an intermediate layer composed of Al—O or Cu, etc., and a free layer composed of a layer including a Ni—Fe based alloy or Co—Fe based alloy, etc.

Next, formation in the sensor height direction is carried out. Hereafter, a formation process in the sensor height direction will be explained using FIGS. 13 and 14.

At first, the first stopper layer for sensor height 41 is deposited on the magnetoresistive film 3. This first stopper layer for sensor height 41 is formed by depositing a metallic material using sputtering, ion beam sputtering or a CVD technique. As mentioned above, a material which has a lower polishing rate by CMP, that is, one which has a high hardness, is suitable for the first stopper layer for sensor height 41 for functioning as a stopper for CMP. The thickness of the first stopper layer for sensor height 41 is preferably as thin as possible, about 10 nm or less, in order to shorten the etching time while simultaneously etching with the magnetoresistive film by using IBE in the subsequent process. Therefore, considering that the actual polishing time is about 60 seconds, it is appropriate that a material having a polishing rate less than 10 nm/min is used, and it is necessary that it be composed of a metallic material, which has a Vickers hardness at least greater than about 80 Hv, selected from Table 1 and FIG. 5. A metallic material selected from a group of Co, Cr, Mo, Hf, Ir, Nb, Re, Rh, Ru, and W or an alloy including these materials can be used as a definite material.

Next, a resist is coated on the first stopper layer for sensor height 41, exposed by using a stepper, and patterned into a desired shape by developing using a developer to make the resist mask 11 (FIG. 13(a) or FIG. 14(a)).

Next, dry-etching such as IBE and RIE, etc. is carried out on the first stopper layer for sensor height 41 and the magnetoresistive film 3 to form a pattern in the sensor height direction by etching (FIG. 13(b) or FIG. 14(b)). In the case when IBE is used for etching, it is possible to apply an etching in which the incident angle is changed during etching. In this case, it is preferable that the ion beam etching be carried out again with the second incidence angle tilted greater than the first incidence angle for etching against the substrate. This process makes it possible to remove the redepositions deposited on the sensor wall during the first etching. Moreover, the redepositions deposited on the sensor wall can be removed by a plurality of repetition of alternating the first etching and the second etching. Furthermore, different etching techniques may be used for the first etching and the second etching.

Next, the refill film along sensor height direction 6 is deposited by using sputtering, ion beam sputtering, or a CVD technique. At least the part of the refill film along sensor height direction 6 connected to the magnetoresistive film 3 is formed of an insulator material such as Al oxide or Si oxide. Next, in order to protect the refill film along sensor height direction 6, the second stopper layer for sensor height 42 is deposited (FIG. 13(c) or FIG. 14(c)). The second stopper layer for sensor height 42 is one to protect the refill film along track width direction 1 and the longitudinal bias layer or side shield layer 5, and is composed of DLC or the same metallic material as the first stopper layer for sensor height 41 described above.

Then, lift-off is carried out. First, the resist mask 11 is removed by using CMP (FIG. 13(d) or FIG. 14(d)). At this time, the resist mask 11 except for the sensor height formation part may be removed beforehand using an organic solvent.

Next, in the embodiments 2-1 and 2-2, the first stopper layer for sensor height 41 and the second stopper layer for sensor height 42 are removed by etching (FIG. 13(e)). Moreover, in the case when the first stopper layer for sensor height 41 is not removed as described in the embodiments 2-3 and 2-4, the configuration shown in FIG. 14(e) can be obtained.

In the case when the first stopper layer for sensor height 41 is not removed, it should be considered that the resistance of the first stopper layer for sensor height 41 becomes extra resistance which has no relation in changing the magnetoresistance. That is, it is preferable that the first stopper layer for sensor height 41 be composed of a noble metal (concretely, Rh, Ir, and Ru) or an alloy including them which has a low resistance, selected from the metallic materials which may be the first stopper layer for sensor height 41 mentioned above.

When 20,000 elements which have the length of the resist mask 11 in the sensor height direction being 50 nm were manufactured by using 10 nm thick Rh for the first stopper layer for sensor height 41 and 10 nm thick DLC for the second stopper layer for sensor height 42 in the actual formation in the sensor height direction, lift-off was possible for all elements and there was no fence.

After this process, formation in the track width is carried out. First, the first stopper layer for track 51 is deposited on the magnetoresistive film 3 and on the first stopper layer for sensor height 41 during formation of the sensor height. The first stopper layer for track 51 is formed by depositing a metallic material using sputtering, ion beam sputtering or a CVD technique. As mentioned above, a material which has a lower polishing rate by CMP, that is, one which has a high hardness, is suitable for the first stopper layer for track 51 for functioning as a stopper for CMP. The thickness of the first stopper layer for track 51 is preferably as thin as possible, about 10 nm or less, in order to shorten the etching time while simultaneously etching with the magnetoresistive film by using IBE in a subsequent process. Therefore, considering that the actual polishing time is about 60 seconds, it is appropriate that a material having a polishing rate less than 10 nm/min be used, and it is necessary that it be composed of a metallic material, which has a Vickers hardness at least greater than about 80 Hv, selected from FIG. 5. A metallic material selected from a group of Co, Cr, Mo, Hf, Ir, Nb, Re, Rh, Ru, and W or an alloy including these materials can be used as a definite material.

Next, a resist is coated on the first stopper layer for track 51, exposed by using a stepper, and patterned into a desired shape by developing using a developer to make the resist mask 8 (FIG. 15(a), FIG. 16(a), FIG. 17(a), or FIG. 18(a)). The length of the resist mask 8 in the sensor height direction is made to be longer than the length of the resist mask 11 in the sensor height direction for forming the sensor height. Thereby, in the vicinity of the magnetoresistive film 3 in the sensor height direction, the refill film along sensor height direction 6 is prevented from polishing by CMP in the subsequent lift-off process. When the refill film along sensor height direction 6 is polished by CMP, a sense current might leak between the upper shield layer 2 and the lower shield layer 4 without passing the free layer part of the magnetoresistive film 3 in the manufactured magneto-resistive sensor. Therefore, making the length of the resist mask 8 in the sensor height direction longer than the length of the resist mask 11 in the sensor height direction for the formation of sensor height is an effective method for prevention of the sense current.

Next, dry-etching by using IBE or RIE is carried out to form a pattern in the track width direction by etching (FIG. 15(b), FIG. 16(b), FIG. 17(b), or FIG. 18(b)). In the case when IBE is used for etching, it is possible to apply an etching in which the incident angle is changed during etching. In this case, it is preferable that the ion beam etching be carried out again with the second incidence angle tilted greater than the first incidence angle for etching against the substrate. This process makes it possible to remove the redepositions deposited on the sensor wall during the first etching. Moreover, one may perform a plurality of repetition of alternating first etching and second etching. Furthermore, different etching techniques may be used for the first etching and the second etching.

Next, the refill film along track width direction 1, the longitudinal bias layer or side shield layer 5, and the second stopper layer for track 52 are deposited in order (FIG. 15(c), FIG. 16(c), FIG. 17(c), or FIG. 18(c)). At least the part of the refill film along track width direction 1 connected to the magnetoresistive film 3 is formed of an insulator material such as Al oxide or Si oxide, etc. There need not be a longitudinal bias layer or side shield layer 5. The second stopper layer for track 52 is the one to protect the refill film along track width direction 1 and the longitudinal bias layer or side shield layer 5, and may be composed of either DLC or the same metallic material as the first stopper layer for track 51 described above.

Then, lift-off is carried out. First, the resist mask 8 is removed by using CMP (FIG. 15(d), FIG. 16(d), FIG. 17(d), or FIG. 18(d)). At this time, the resist mask 8 except for the read sensor part may be removed beforehand using an organic solvent.

Next, in the embodiments 2-1 and 2-3, the first stopper layer for track 51 and the stopper layer for track 52 are removed by etching (embodiment 2-1 FIG. 15(e), embodiment 2-3: FIG. 17(e)). Moreover, in the case when the first stopper layer for sensor height 41 is not removed as described in the embodiments 2-2 and 2-4, the shapes shown in FIG. 16(e) and FIG. 18(e) can be obtained, respectively.

In the case when the first stopper layer for track 51 is not removed, it should be considered that the resistance of the first stopper layer for track 51 becomes extra resistance which has no relation in changing the magnetoresistance. That is, it is preferable that the first stopper layer for track 51 be composed of a noble metal (concretely, Rh, Ir, and Ru) or an alloy including them which has a low resistance, selected from the metallic materials which may be the first stopper layer for track 51 mentioned above. Moreover, in the case when the first stopper layer for sensor height 41 or the second stopper layer for sensor height 42 for the sensor height formation is left without being removed during the formation in the sensor height direction, these may be removed at this time.

When 20,000 elements having a track width of 50 nm were manufactured by using 10 nm thick Rh for the first stopper layer for track 51 and 10 nm thick DLC for the second stopper layer for track 52 in the actual formation in the track width direction, lift-off was possible for all elements and there was no fence.

After this process, the upper shield layer 2 composed of a soft magnetic material is formed on top of the magnetoresistive film 3 (FIG. 15(f), FIG. 16(f), FIG. 17(f), or FIG. 18(f)). This upper shield layer 2 also works as an upper electrode. When this upper shield layer 2 is formed, it may be possible that a metallic material such as Ta and NiCr, etc. is deposited on top of the magnetoresistive film 3 as an underlayer and then the upper shield layer 2 is formed.

Figure 19:
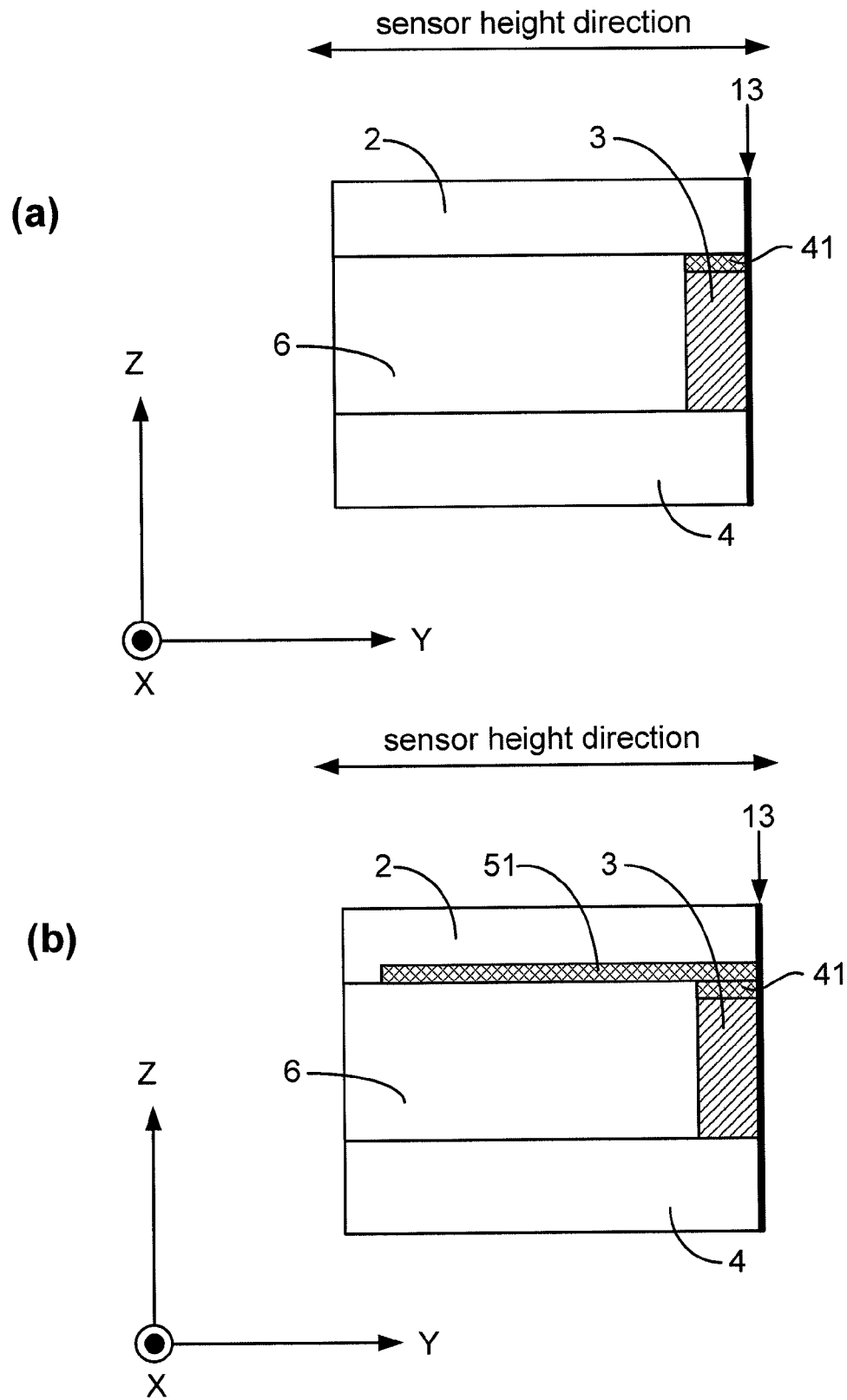
FIG. 19 is a schematic drawing illustrating a cross-section in the sensor height direction showing an example of a magneto-resistive sensor of the embodiment 2.

The magneto-resistive sensor fabricated in the embodiment 2-1 has a cross-sectional configuration in the sensor height direction as shown in FIG. 2 and a cross-sectional configuration in the track width direction as shown in FIG. 15(f). The magneto-resistive sensor fabricated in the embodiment 2-2 has a cross-sectional configuration in the sensor height direction as shown in FIG. 10 and a cross-sectional configuration in the track width direction as shown in FIG. 16(f). The magneto-resistive sensor fabricated in the embodiment 2-3 has a cross-sectional configuration in the sensor height direction as shown in FIG. 19(a) and a cross-sectional configuration in the track width direction as shown in FIG. 17(f). The magneto-resistive sensor fabricated in the embodiment 2-4 has a cross-sectional configuration in the sensor height direction as shown in FIG. 19(b) and a cross-sectional configuration in the track width direction as shown in FIG. 18(f).

After this, the magneto-resistive sensor of the present invention can be obtained by forming the air bearing surface 13 by the slider formation process after passing the process for forming terminals or the process for forming a write sensor for recording information in a medium. FIG. 11 is a cross-sectional drawing in the sensor height direction illustrating a magneto-resistive sensor in which a write sensor is provided. In the case of longitudinal recording, a write sensor consists of a lower pole 18, an upper pole 19, a coil 20, a coil insulator 21, a recording gap 22, and an upper yoke 31 as shown in FIG. 11(a). Moreover, in the case of a perpendicular magnetic storage, a write sensor consists of an adjunct pole 23, a main pole 24, a coil 20, and a coil insulator 21 as shown in FIG. 11(b).

Furthermore, it is possible to fabricate a magnetic storage by mounting the magneto-resistive sensor 25 of the present invention at the tip of the gimbals 26, and by providing a recording medium 27, a voice coil 28, a spindle 29, and a signal processing circuit 30 as shown in FIG. 12.

Although the present invention as described in detail above with reference to the magnetoresistive film 3 was explained using one which consists of a pinned layer composed of a layer including a Co—Fe based alloy ferromagnetic, an intermediate layer composed of Al—O or Cu, etc., and a free layer composed of a layer including a Ni—Fe based alloy or a Co—Fe based alloy, these are specific examples and the present invention is not limited to these examples. Besides this structure, the effects of the present invention are not changed by reasonable variations and modifications of the devices which carry a detection current nearly in the direction perpendicular to the film surface of the material constituting the magnetoresistive film such as, for instance, a magnetoresistive film using a high polarizability material for the pinned layer or the free layer, a magnetoresistive film providing a current screen layer in the pinned layer, intermediate layer, and the free layer, a magneto-resistive sensor using a magnetic semiconductor, and a magneto-resistive sensor using a diffusion and accumulation phenomena of the polarized spin.

Moreover, although the aforementioned examples described a magneto-resistive sensor in which the magnetoresistive film 3 is arranged so as to be exposed to the air bearing surface 13, the same effects can be obtained in a magneto-resistive sensor in which a part of the magnetoresistive film 3 is arranged to be exposed to the air bearing surface and a magneto-resistive sensor in which the magnetoresistive film 3 is arranged separated from the air bearing surface. Herein, in the case of the embodiment 2-2, the first stopper layer for track 51 is placed on top of the magnetoresistive layer 3, the same as FIG. 10, so that the configuration will be one where the length in the sensor height direction is longer than the sensor height of the magnetoresistive film 3. In the case when the fabrication is carried out leaving the first stopper layer for sensor height 41 during the formation in the sensor height direction according to the embodiment 2-3, the configuration will be one where they exist only on top of each magnetoresistive film 3. Moreover, in the case of the embodiment 2-4, the first stopper layer for track 51 is placed on top of the magnetoresistive layer 3, the same as FIG. 19(b), so that the configuration will be one where the length in the sensor height direction is longer than the sensor height of the magnetoresistive film 3.

Moreover, although the aforementioned examples described a method for fabricating a CPP type magneto-resistive sensor, the same method can be employed for fabricating a CIP type magneto-resistive sensor. In this case, an insulator layer has to be placed between the magnetoresistive film 3, the lower shield layer 4, and the upper shield layer 3. Moreover, the refill film along track width direction 1 is not necessary, and a longitudinal bias layer or side shield layer 5, which also works as an electrode, becomes necessary.

EMBODIMENT 3

Figure 20:
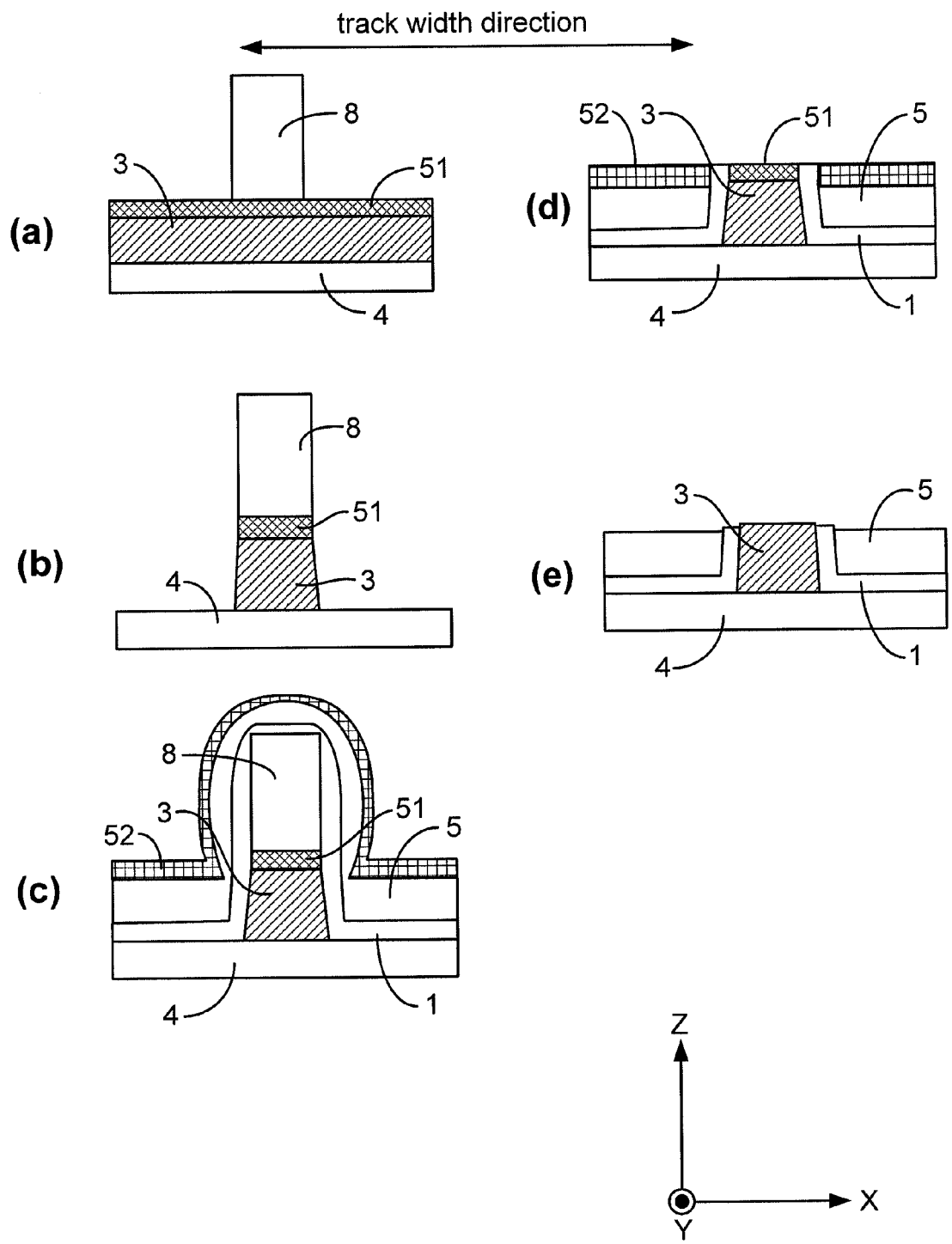
FIG. 20 is a schematic drawing illustrating a cross-section in the track width direction to explain a process for forming the track in a method for fabricating a CPP type magneto-resistive sensor of the embodiment 3-1 or embodiments 4-1 and 4-2.

This embodiment is one in which the sensor height is formed after the formation of the track of the magnetoresistive film as shown in FIG. 6, and it is separated into the case when the first stopper layer for track 51 is removed (embodiment 3-1) and when it is not removed (embodiment 3-2) which will be described later during the track formation process. FIG. 20 shows the track formation process described in the embodiment 3-1, and FIG. 21 the track formation process described in the embodiment 3-2. FIG. 22 shows the sensor height formation process described in the embodiment 3-1, and FIG. 23 the sensor height formation process described in the embodiment 3-2.

The process for fabricating a magneto-resistive sensor of this embodiment will be described as follows. At first, an insulator such as $Al_2O_3$, etc. is deposited on the surface of a substrate composed of alumina titanium carbide, etc. and the lower shield layer 4 is formed after applying precision polishing using CMP. It is formed by patterning into a predetermined shape a film composed of a Ni—Fe based alloy deposited by using, for instance, sputtering, ion beam sputtering, or plating. This lower shield layer 4 also works as a lower electrode. By growing $Al_2O_3$ on top of this and applying CMP, the surface of the substrate becomes a surface where the lower shield layer 3 and $Al_2O_3$ are planarized. Moreover, an extraction electrode film is formed at the part separated from the place where the magnetoresistive film is formed in the following process. This consists of a laminated film of, for instance, Ta and Au, etc.

The magnetoresistive film 3 is formed on the lower magnetic shield 4 by using, for instance, sputtering and ion beam sputtering. The magnetoresistive film consists of a pinned layer composed of a layer including, for instance, a Co—Fe based alloy ferromagnetic, an intermediate layer composed of Al—O or Cu, etc., and a free layer composed of a layer including a Ni—Fe based alloy or Co—Fe based alloy, etc.

Next, formation in the track width direction is carried out. Hereafter, a formation process in the track width direction will be explained using FIGS. 20 and 21.

First, the first stopper layer for track 51 is deposited on the magnetoresistive film 3. This first stopper layer for track 51 is formed by depositing a metallic material using sputtering, ion beam sputtering or a CVD technique. As mentioned above, a material which has a lower polishing rate by CMP, that is, one which has a high hardness, is suitable for the first stopper layer for track 51 for functioning as a stopper for CMP. The thickness of the first stopper layer for track 51 is preferably as thin as possible, about 10 nm or less, in order to shorten the etching time while simultaneously etching with the magnetoresistive film by using IBE in a subsequent process. Therefore, considering that the actual polishing time is about 60 seconds, it is appropriate that a material having a polishing rate less than 10 nm/min is used, and it is necessary that it be composed of a metallic material, which has a Vickers hardness at least greater than about 80 Hv, selected from Table 1 and FIG. 5. A metallic material selected from a group of Co, Cr, Mo, Hf, Ir, Nb, Re, Rh, Ru, and W or an alloy including these materials can be used as a definite material.

Figure 21:
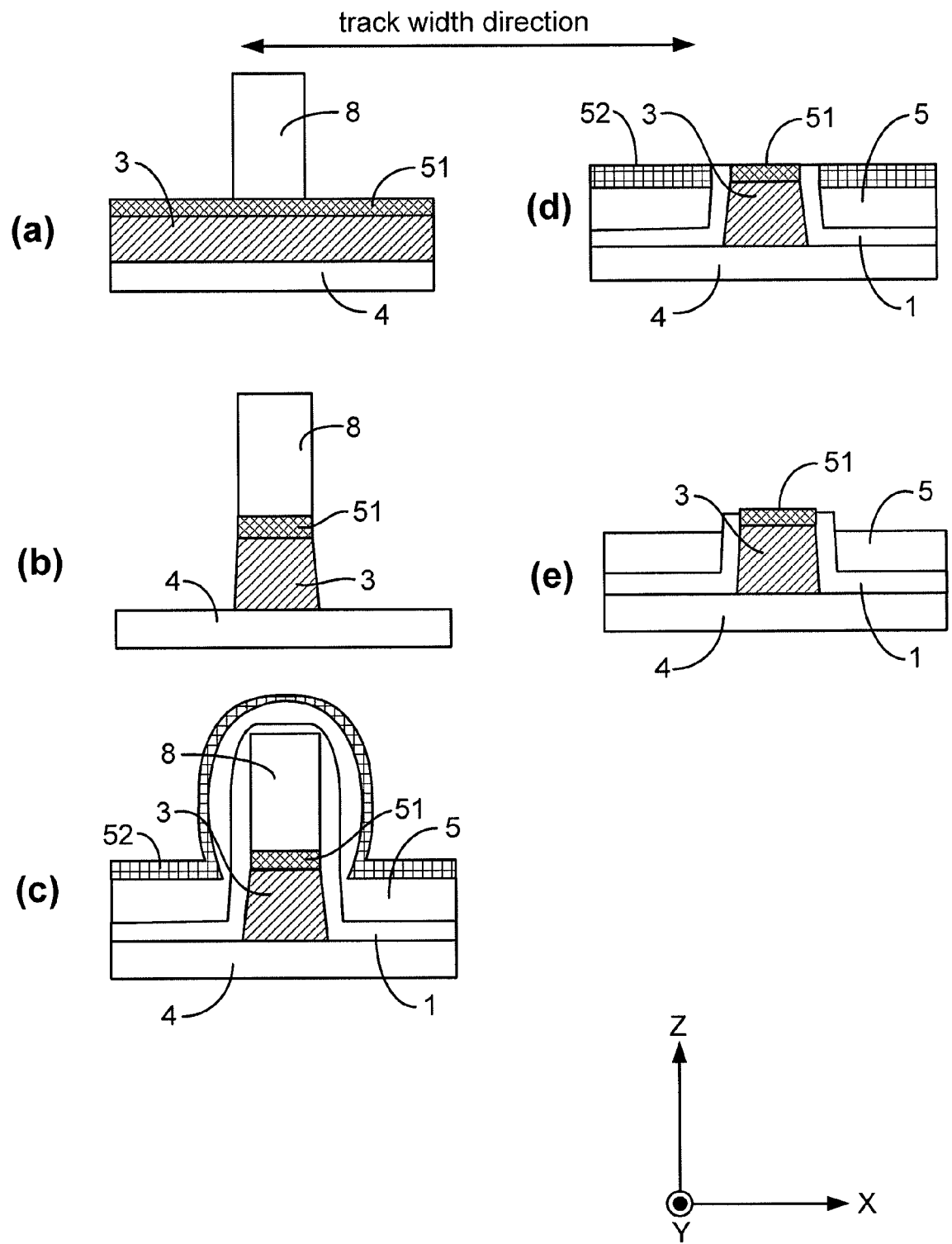
FIG. 21 is a schematic drawing illustrating a cross-section in the track width direction to explain a process for forming the track in a method for fabricating a CPP type magneto-resistive sensor of the embodiment 3-2 or embodiments 4-3 and 4-4.
Figure 22:
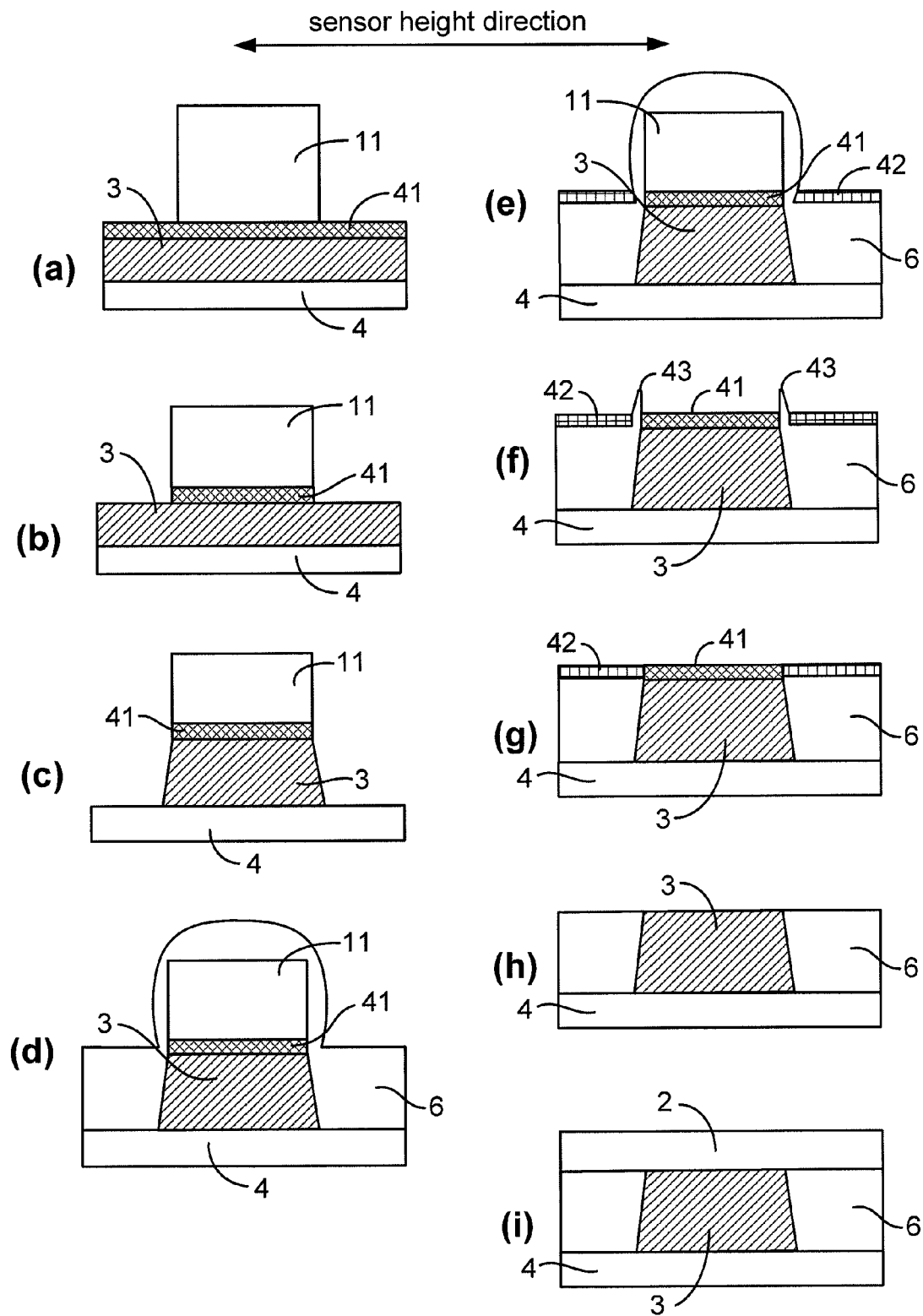
FIG. 22 is a schematic drawing illustrating a cross-section in the sensor height direction to explain a process for forming the sensor height direction in a method for fabricating a CPP type magneto-resistive sensor of the embodiment 3-1.

Next, a resist is coated on the first stopper layer for track 51, exposed by using a stepper, and patterned into a desired shape by developing using a developer to make the resist mask 8 (FIG. 20(*a*) or FIG. 21(*a*)). The length of the resist mask 8 in the sensor height direction is preferably made to be the same or longer than the length of the resist mask 11 in the sensor height direction for forming the sensor height direction which will be done after the formation in the track width direction.

Next, dry-etching by using IBE and RIE, etc. is carried out on the magnetoresistive film 3 and on the first stopper layer for track 51 to form a pattern in the track direction by etching (FIG. 20(*b*) or FIG. 21(*b*)). In the case when IBE is used, it is possible to apply an etching in which the incident angle is changed during etching. In this case, it is preferable that etching be carried out again with the second incidence angle tilted greater than that of the first etching against the substrate. This process makes it possible to remove the redepositions deposited on the sensor wall during the first etching. Moreover, one may perform a plurality of repetition of alternating first etching and second etching. Furthermore, different etching techniques may be used for the first etching and the second etching.

Next, the refill film along track width direction 1, the longitudinal bias layer or side shield layer 5, and the second stopper layer for track 52 are deposited in order (FIG. 20(*c*) or FIG. 21(*c*)). At least the part of the refill film along track width direction 1 connected to the magnetoresistive film 3 is formed of an insulator material such as Al oxide or Si oxide. There need not be a longitudinal bias layer or side shield layer 5. The second stopper layer for track 52 is one to protect the refill film along track width direction 1 and the longitudinal bias layer or side shield layer 5, and may be composed of either DLC or the same metallic material as the first stopper layer for track 51 described above.

Then, lift-off is carried out. First, the resist mask 8 is removed by using CMP (FIG. 20(*d*) or FIG. 21(*d*)). At this time, the resist mask 8 except for the read sensor part may be removed beforehand using an organic solvent.

Next, in the embodiment 3-1, the first stopper layer for track 51 and the stopper layer for track 52 are removed by etching (FIG. 20(*e*)). Moreover, in the case when the first stopper layer for track 51 is not removed as described in the embodiment 3-2, the configurations shown in FIG. 21(*e*) can be obtained, respectively.

In the case when the first stopper layer for track 51 is not removed, it should be considered that the resistance of the first stopper layer for track 51 becomes extra resistance which has no relation in changing the magnetoresistance. That is, it is preferable that the first stopper layer for track 51 be composed of a noble metal (concretely, Rh, Ir, and Ru) or an alloy including them which has a low resistance, selected from the metallic materials which may be the first stopper layer for track 51 mentioned above.

When 20,000 elements having a track width of 50 nm were manufactured by using 10 nm thick Rh for the first stopper layer for track 51 and 10 nm thick DLC for the second stopper layer for track 52 in the actual formation in the track width direction, lift-off was possible for all elements and there was no fence.

After the formation in the track direction, the formation in the sensor height direction is carried out. Hereafter, the method for forming in the sensor height direction will be described using FIGS. 22 and 23.

First, the first stopper layer for sensor height 41 is deposited on the magnetoresistive film 3. This first stopper layer for sensor height 41 is formed by depositing DLC using ion beam sputtering or a CVD technique. Next, a resist is coated on the magnetoresistive film 3, exposed by using a stepper, and patterned into a desired shape by developing using a developer to make the resist mask 11 (FIG. 22(*a*) or FIG. 23(*a*)). Length A of the first stopper layer for track 51 in the sensor height direction during the track formation shown in FIG. 23(*a*) is one decided by the length of the resist mask 8 in the sensor height direction during track formation.

Figure 23:
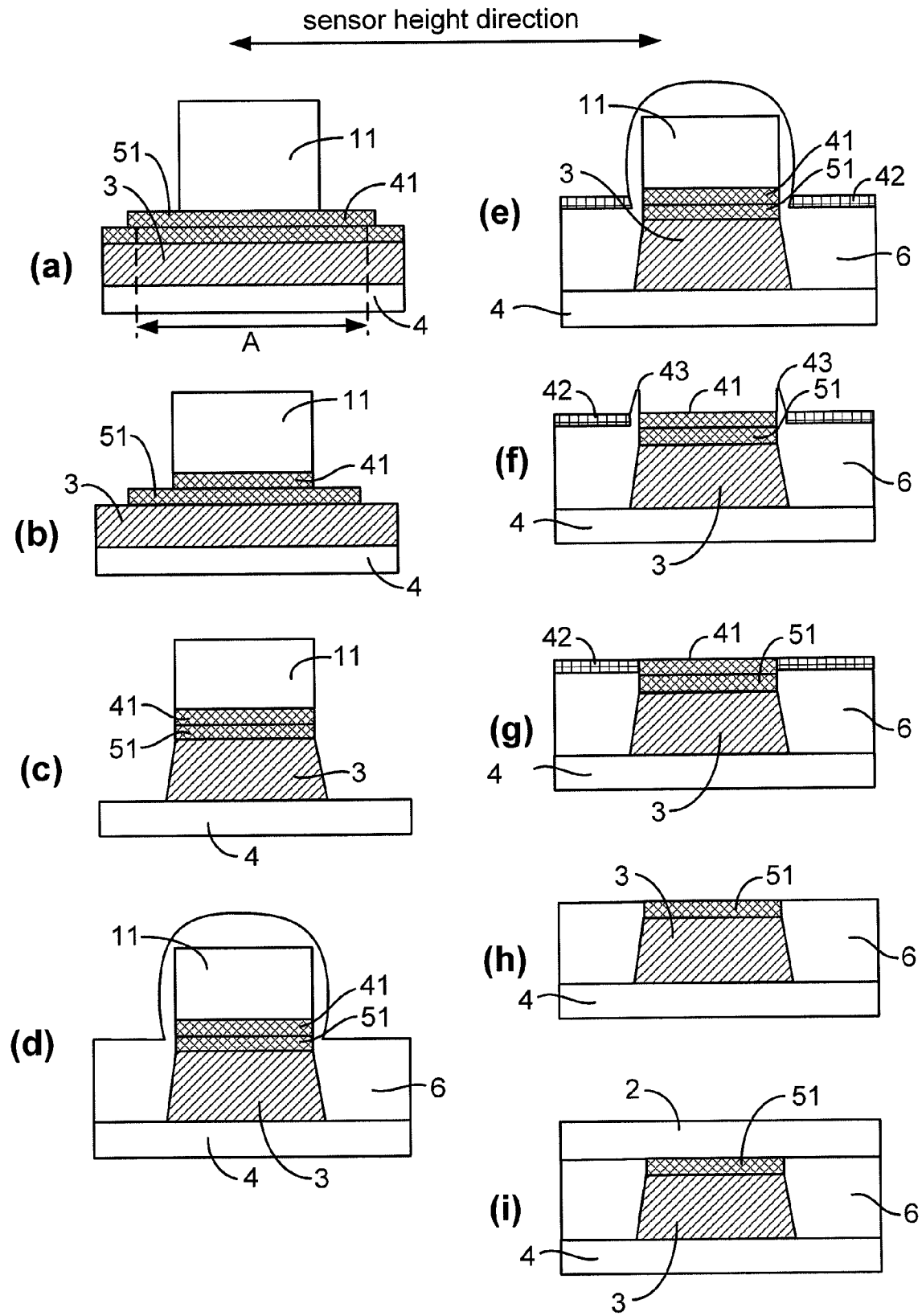
FIG. 23 is a schematic drawing illustrating a cross-section in the sensor height direction to explain a process for forming the sensor height direction in a method for fabricating a CPP type magneto-resistive sensor of the embodiment 3-2.

Next, RIE is carried out on the first stopper layer for sensor height 41 to remove the region of the first stopper layer for sensor height 41 except for the sensor part (FIG. 22(*b*) or FIG. 23(*b*)).

Next, dry-etching by using IBE and RIE, etc. is carried out on the magnetoresistive film 3 to form a pattern in the sensor height direction (FIG. 22(*c*) or FIG. 23(*c*)). In the case when IBE is used, it is possible to apply an etching in which the incident angle is changed during etching. In this case, it is preferable that ion beam etching be carried out again with the second incidence angle tilted greater than that of the first etching against the substrate. This process makes it possible to remove the redepositions deposited on the sensor wall during the first etching. Moreover, the redepositions deposited on the sensor wall can be removed by a plurality of repetition of alternating the first etching and the second etching. Furthermore, different etching techniques may be used for the first etching and the second etching.

Next, the refill film along sensor height direction 6 is deposited by using sputtering, ion beam sputtering, or a CVD technique (FIG. 22(d) or FIG. 23(d)). At least the part of the refill film along sensor height direction 6 connected to the magnetoresistive film 3 is formed of an insulator material such as Al oxide or Si oxide. Next, the second stopper layer for sensor height 42 is deposited to protect the refill film along sensor height direction 6 (FIG. 22(e) or FIG. 23(e)). This second stopper layer for sensor height 42 is formed by depositing DLC using ion beam sputtering or a CVD technique.

Then, lift-off is carried out. First, the resist mask 11 is removed by using an organic solvent (FIG. 22(f) or FIG. 23(f)). At this time, there is a situation where a fence is created as shown in FIG. 22(f) and FIG. 23(f) or the resist mask 11 not completely removed, but these are removed by CMP applied in the next step. The process for removing the resist mask 11 using an organic solvent may be omitted. Next, CMP is applied and the fence 43 or the resist mask 11 which has not been removed is removed (FIG. 22(g) or FIG. 23(g)). Finally, the formation in the sensor height direction is completed by removing the first stopper layer for sensor height 41 and the second stopper layer for sensor height 42 by using RIE (FIG. 22(h) or FIG. 23(h)).

Herein, a method for forming the sensor height direction applying a lift-off technique by CMP using DLC is described, and a process for removing the resist mask 11 using an organic solvent may be only carried out without providing the first stopper layer for sensor height 41 and the second stopper layer for sensor height 42.

After this process, the upper shield layer 2 composed of a soft magnetic material is formed and the magneto-resistive sensor is completed (FIG. 22(i) or FIG. 23(i)). This upper magnetic shield 2 also works as an upper electrode. When this upper shield layer 2 is formed, it may be possible that a metallic material such as Ta and NiCr, etc. is deposited on top of the magnetoresistive film 3 as an underlayer and then the upper shield layer 2 is formed. The air bearing surface of the magneto-resistive sensor fabricated in the embodiment 3-1 becomes the configuration shown in FIG. 24(a), and the air bearing surface of the magneto-resistive sensor fabricated in the embodiment 3-2 becomes the configuration shown in FIG. 24(b).

After this, the magneto-resistive sensor of the present invention can be obtained by forming the air bearing surface 13 by the slider formation process after passing the process for forming terminals or the process for forming a write sensor for recording information in a medium. FIG. 11 is a cross-sectional drawing in the sensor height direction illustrating a magneto-resistive sensor in which a write sensor is provided. In the case of longitudinal recording, a write sensor consists of a lower pole 18, an upper pole 19, a coil 20, a coil insulator 21, a recording gap 22, and an upper yoke 31 as shown in FIG. 11(a). Moreover, in the case of a perpendicular magnetic storage, a write sensor consists of an adjunct pole 23, a main pole 24, a coil 20, and a coil insulator 21 as shown in FIG. 11(b).

Furthermore, it is possible to fabricate a magnetic storage by mounting the magneto-resistive sensor 25 of the present invention at the tip of the gimbals 26, and by providing a recording medium 27, a voice coil 28, a spindle 29, and a signal processing circuit 30 as shown in FIG. 12.

Although the present invention as described in detail above with reference to the magnetoresistive film 3 was explained using one which consists of a pinned layer composed of a layer including a Co—Fe based alloy ferromagnetic, an intermediate layer composed of Al—O or Cu, etc., and a free layer composed of a layer including a Ni—Fe based alloy or a Co—Fe based alloy, these are specific examples and the present invention is not limited to these examples. Besides this structure, the effects of the present invention are not changed by reasonable variations and modifications of the devices which carry a detection current nearly in the direction perpendicular to the film surface of the material constituting the magnetoresistive film such as, for instance, a magnetoresistive film using a high polarizability material for the pinned layer or the free layer, a magnetoresistive film providing a current screen layer in the pinned layer, intermediate layer, and the free layer, a magneto-resistive sensor using a magnetic semiconductor, and a magneto-resistive sensor using a diffusion and accumulation phenomena of the polarized spin.

Moreover, although the aforementioned examples described a magneto-resistive sensor in which the magnetoresistive film 3 is arranged so as to be exposed to the air bearing surface 13, the same effects can be obtained in a magnetoresistive sensor in which a part of the magnetoresistive film 3 is arranged to be exposed to the air bearing surface and a magneto-resistive sensor in which the magnetoresistive film 3 is arranged separated from the air bearing surface. In the case when the first stopper layer for track 51 is left on the magnetoresistive film without being removed, it is possible, the same as FIG. 10, that the length of the first stopper layer for track 51 in the sensor height direction is made longer than the length of the magnetoresistive film 3 in the sensor height direction.

Moreover, although the aforementioned examples described a method for fabricating a CPP type magnetoresistive sensor, the same method can be employed for fabricating a CIP type magneto-resistive sensor. In this case, an insulator layer has to be placed between the magnetoresistive film 3, the lower shield layer 4, and the upper shield layer 3. Moreover, the refill film along track width direction 1 is not necessary, and a longitudinal bias layer or side shield layer 5, which also works as an electrode, becomes necessary.

EMBODIMENT 4

The embodiment 3 described a method for fabricating a magneto-resistive sensor when the first stopper layer for sensor height 41 during the formation in the sensor height direction is formed of DLC. However, the fabricating method described as follows is needed in the case when it is necessary to make small the length in the sensor height direction of the resist mask 11 in the sensor height direction.

This embodiment can be divided into a total of four cases; the case when the first stopper layer for track 51 is removed in the formation process of the track, and the case when not removed; the case when the first stopper layer for sensor height 41 is removed in the formation process of the sensor height, and the case when not removed. Hereafter, the explanation will be carried out as follows; the case when both the first stopper layer for track 51 and the first stopper layer for sensor height 41 are removed is assumed to be the embodiment 4-1; the case when the first stopper layer for track 51 is removed and the first stopper layer for sensor height 41 is not removed is assumed to be the embodiment 4-2; the case when the first stopper layer for track 51 is not removed and the first stopper layer for sensor height 41 is removed is assumed to be the embodiment 4-3; and the case when neither the first stopper layer for track 51 nor the first stopper layer for sensor height 41 is removed is assumed to be the embodiment 4-4.

FIGS. 20 and 21 are cross-sectional drawings in the sensor height direction at the point where the magnetoresistive film 3 is placed that shows the formation process in the track direction. FIG. 20 shows the case when the stopper layer for track 51 is removed (the embodiments 4-1 and 4-2) and FIG. 21 shows the case when it is not removed (the embodiments 4-3 and 4-4). FIGS. 25 to 28 are cross-sectional drawings in the sensor height direction at the point where the magnetoresistive film 3 is placed that shows the formation process of the sensor height in this embodiment. FIGS. 25, 26, 27, and 28 correspond to embodiment 4-1, embodiment 4-2, embodiment 4-3, and embodiment 4-4, respectively.

At first, an insulator such as $Al_2O_3$, etc. is deposited on the surface of a substrate composed of alumina titanium carbide, etc. and the lower shield layer 4 is formed after applying precision polishing using CMP. It is formed by patterning into a predetermined shape a film composed of a Ni—Fe based alloy deposited by using, for instance, sputtering, ion beam sputtering, or plating. This lower shield layer 4 also works as a lower electrode. By growing $Al_2O_3$ on top of this and applying CMP, the surface of the substrate becomes a surface where the lower shield layer 3 and $Al_2O_3$ are planarized. Moreover, an extraction electrode film is formed at the part separated from the place where the magnetoresistive film 3 is formed in the following process. This consists of a laminated film of, for instance, Ta and Au, etc.

The magnetoresistive film 3 is formed on the lower magnetic shield 4 by using, for instance, sputtering and ion beam sputtering. The magnetoresistive film consists of a pinned layer composed of a layer including, for instance, a Co—Fe based alloy ferromagnetic, an intermediate layer composed of Al—O or Cu, etc., and a free layer composed of a layer including a Ni—Fe based alloy or a Co—Fe based alloy, etc.

Next, formation in the track direction is carried out. Hereafter, a formation process in the track width direction will be explained using FIGS. 20 and 21.

At first, the first stopper layer for track 51 is deposited on the magnetoresistive film 3. This first stopper layer for track 51 is formed by depositing a metallic material using sputtering, ion beam sputtering or a CVD technique. As mentioned above, a material which has a lower polishing rate by CMP, that is, one which has a high hardness, is suitable for the first stopper layer for track 51 for functioning as a stopper for CMP. The thickness of the first stopper layer for track 51 is preferably as thin as possible, about 10 nm or less, in order to shorten the etching time while simultaneously etching with the magnetoresistive film by using IBE in the subsequent process. Therefore, considering that the actual polishing time is about 60 seconds, it is appropriate that a material having a polishing rate less than 10 nm/min is used, and it is necessary that it be composed of a metallic material, which has a Vickers hardness at least greater than about 80 Hv, selected from Table 1 and FIG. 5. A metallic material selected from a group of Co, Cr, Mo, Hf, Ir, Nb, Re, Rh, Ru, and W or an alloy including these materials can be used as a definite material.

Next, a resist is coated on the first stopper layer for track 51, exposed by using a stepper, and patterned into a desired shape by developing using a developer to make the resist mask 8 (FIG. 20(a) or FIG. 21(a)). It is preferable that the length of the resist mask 8 in the sensor height direction is the same as the length of the resist mask 11 in the sensor height direction or longer, which is used to form in the sensor height direction after the formation in the track width direction.

Next, dry-etching by using IBE and RIE, etc. is carried out on the magnetoresistive film 3 and on the first stopper layer for track 51 to form a pattern in the track width direction by etching (FIG. 20(b) or FIG. 21(b)). In the case when IBE is used, it is possible to apply an etching in which the incident angle is changed during etching. In this case, it is preferable that etching be carried out again with the second incidence angle tilted greater than that of the first etching against the substrate. This process makes it possible to remove the redepositions deposited on the sensor wall during the first etching. Moreover, one may perform a plurality of repetition of alternating first etching and second etching. Furthermore, different etching techniques may be used for the first etching and the second etching.

Next, the refill film along track width direction 1, the longitudinal bias layer or side shield layer 5, and the second stopper layer for track 52 are deposited in order (FIG. 20(c) or FIG. 21(c)). At least the part of the refill film along track width direction 1 connected to the magnetoresistive film 3 is formed of an insulator material such as Al oxide or Si oxide. There need not be a longitudinal bias layer or side shield layer 5. The second stopper layer for track 52 is one to protect the refill film along track width direction 1 and the longitudinal bias layer or side shield layer 5, and is composed of either DLC or the same metallic material as the first stopper layer for track 51 described above.

Then, lift-off is carried out. First, the resist mask 8 is removed by using CMP (FIG. 20(d) or FIG. 21(d)). At this time, the resist mask 8 except for the read sensor part may be removed beforehand using an organic solvent.

Next, in the embodiment 4-1 and the embodiment 4-2, the first stopper layer for track 51 and the stopper layer for track 52 are removed by etching (FIG. 20(e)). Moreover, in the case when the first stopper layer for track 51 is not removed as described in the embodiment 4-3 and the embodiment 4-4, the shapes shown in FIG. 21(e) can be obtained, respectively.

In the case when the first stopper layer for track 51 is not removed, it should be considered that the resistance of the first stopper layer for track 51 becomes extra resistance which has no relation in changing the magnetoresistance. That is, it is preferable that the first stopper layer for track 51 be composed of a noble metal (concretely, Rh, Ir, and Ru) or an alloy including them which has a low resistance, selected from the metallic materials which may be the first stopper layer for track 51 mentioned above.

When 20,000 elements having a track width of 50 nm were manufactured by using 10 nm thick Rh for the first stopper layer for track 51 and 10 nm thick DLC for the second stopper layer for track 52 in the actual formation in the track width direction, lift-off was possible for all elements and there was no fence.

Next, formation in the sensor height direction is carried out. Hereafter, a formation process in the sensor height direction will be explained using FIGS. 25 to 28.

First, the first stopper layer for sensor height 41 is formed on the magnetoresistive film 3. This first stopper layer for sensor height 41 is formed by depositing a metallic material using sputtering, ion beam sputtering or a CVD technique. As mentioned above, a material which has a lower polishing rate by CMP, that is, one which has a high hardness, is suitable for the first stopper layer for sensor height 41 for functioning as a stopper for CMP. The thickness of the first stopper layer for sensor height 41 is preferably as thin as possible, about 10 nm or less, in order to shorten the etching time while simultaneously etching with the magnetoresistive film by IBE using Ar ions in a subsequent process. Therefore, considering that the actual polishing time is about 60 seconds, it is appropriate that a material having a polishing rate less than 10 nm/min is used, and it is necessary that it be composed of a metallic material, which has a Vickers hardness at least greater than about 80 Hv, selected from Table 1 and FIG. 5. A metallic material selected from a group of Co, Cr, Mo, Hf, Ir, Nb, Re, Rh, Ru, and W or an alloy including these materials can be used as a definite material.

Figure 25:
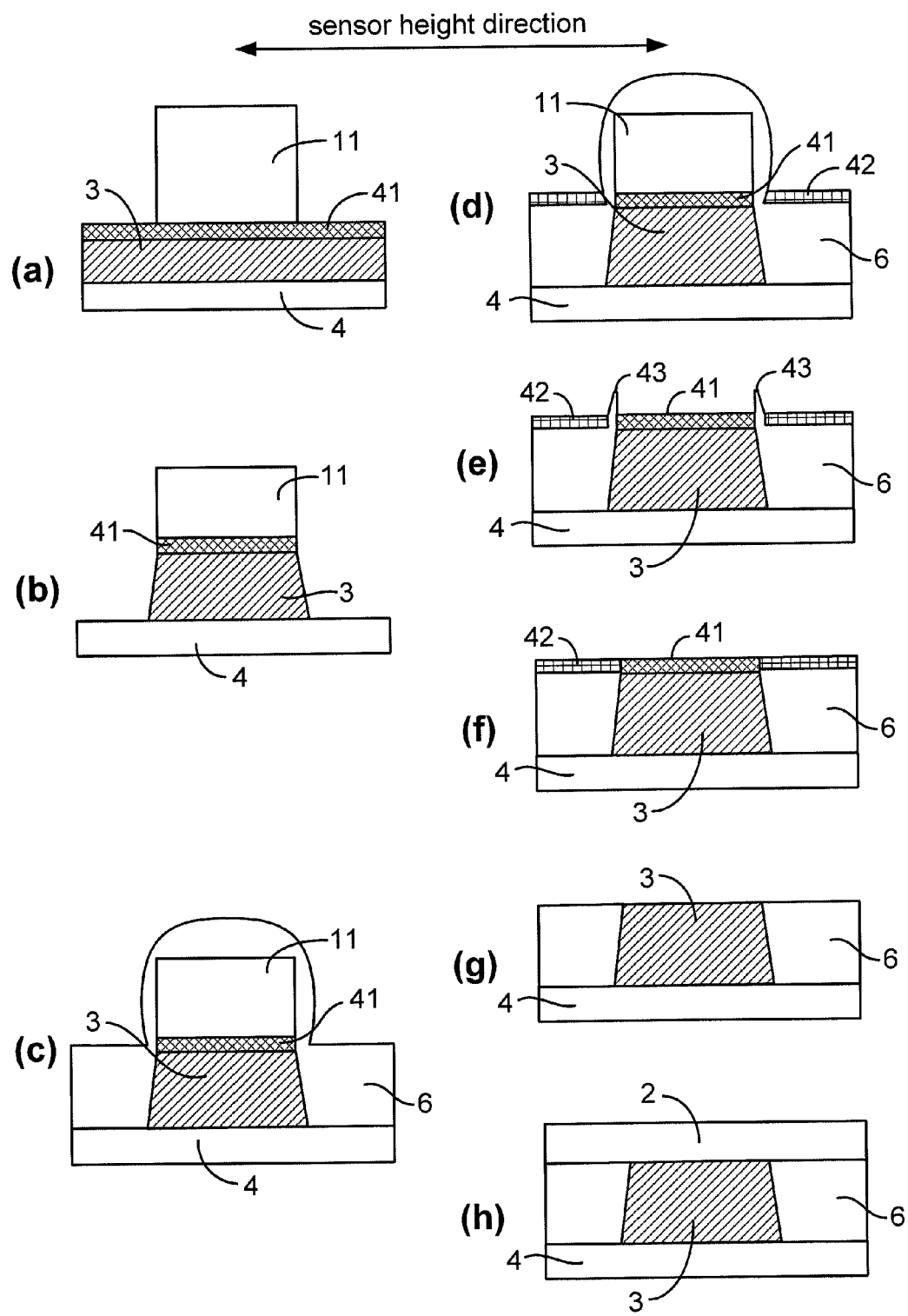
FIG. 25 is a schematic drawing illustrating a cross-section in the sensor height direction to explain a process for forming the sensor height in a method for fabricating a CPP type magneto-resistive sensor of the embodiment 4-1.
Figure 26:
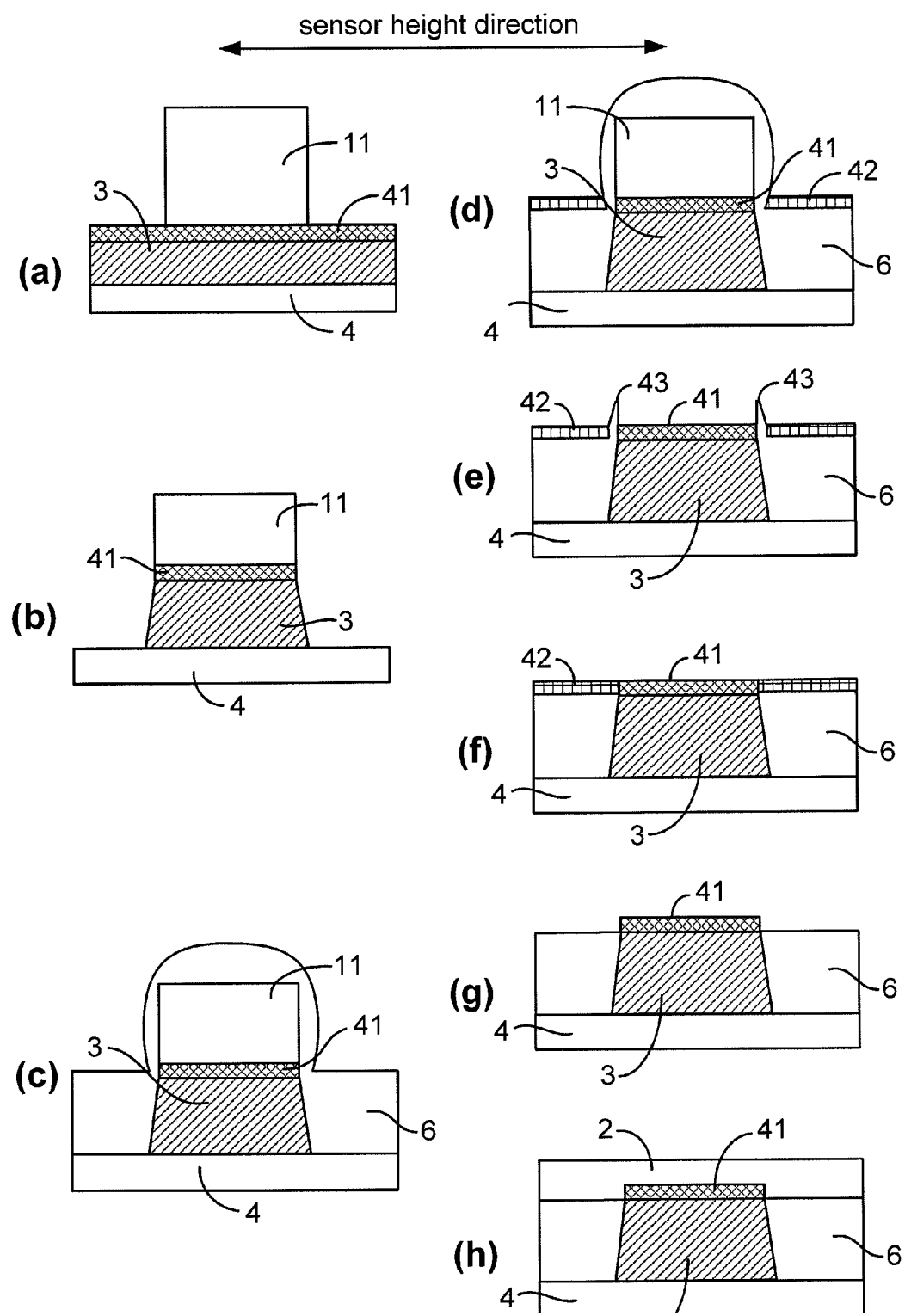
FIG. 26 is a schematic drawing illustrating a cross-section in the sensor height direction to explain a process for forming the sensor height in a method for fabricating a CPP type magneto-resistive sensor of the embodiment 4-2.
Figure 27:
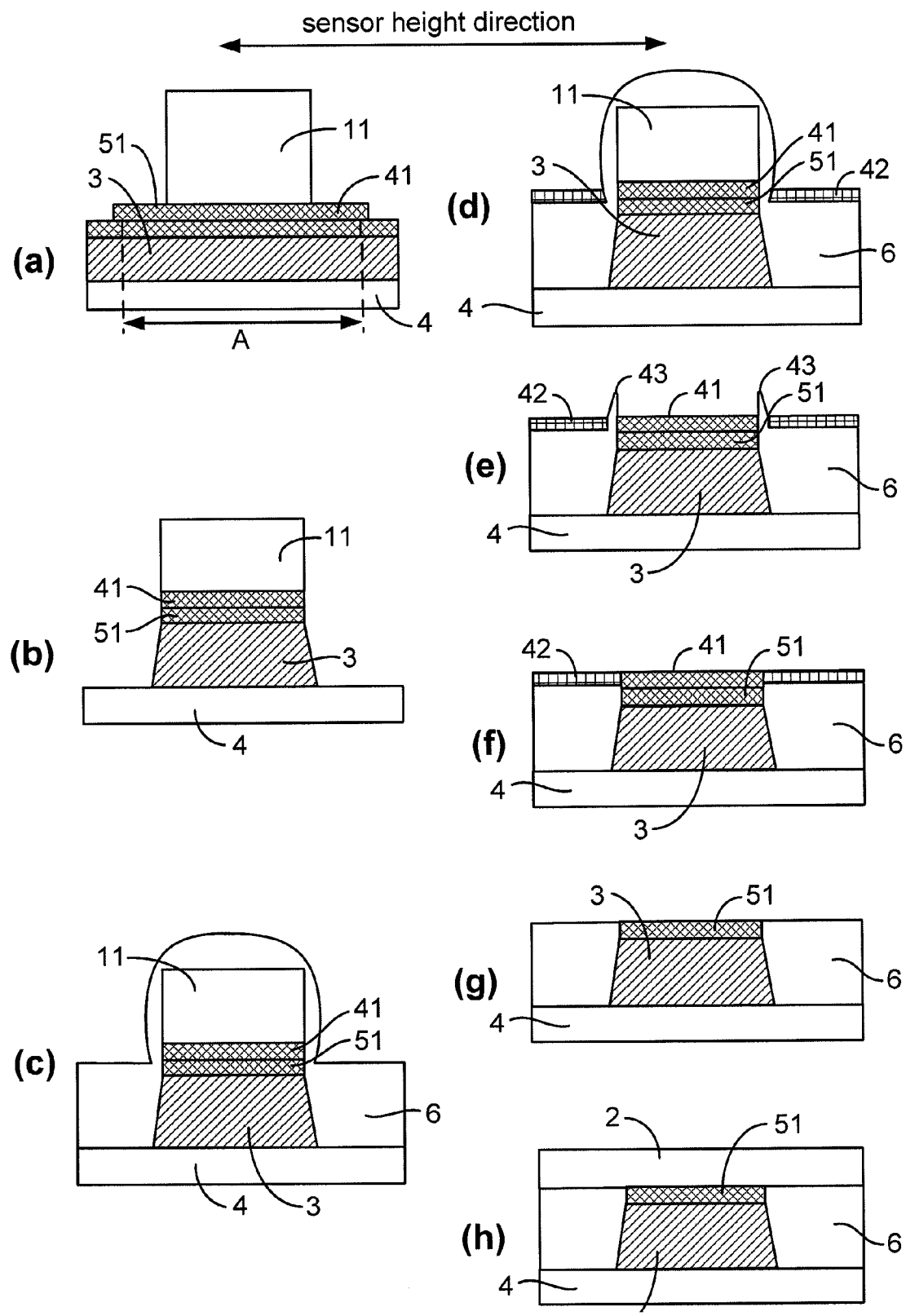
FIG. 27 is a schematic drawing illustrating a cross-section in the sensor height direction to explain a process for forming the sensor height in a method for fabricating a CPP type magneto-resistive sensor of the embodiment 4-3.
Figure 28:
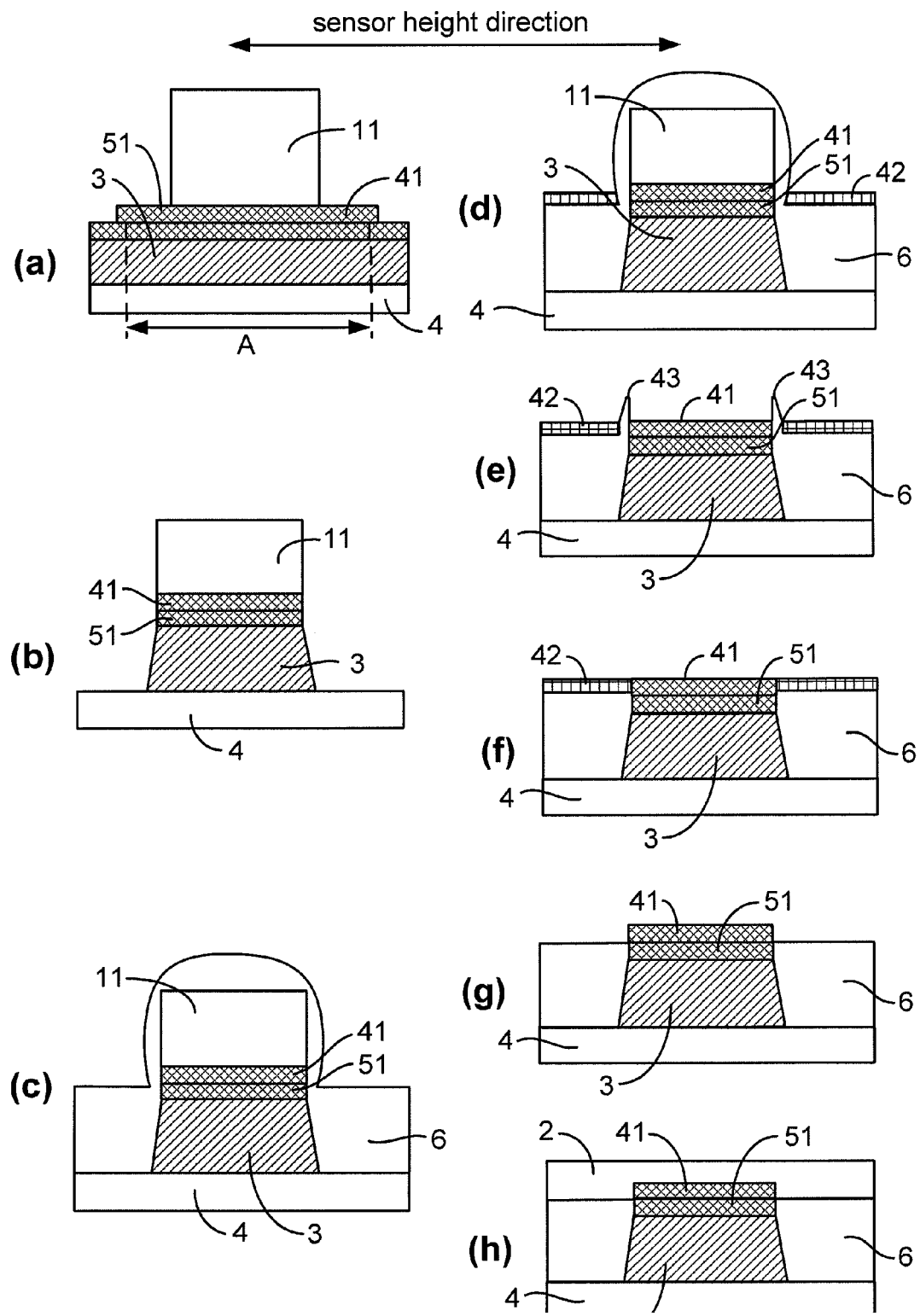
FIG. 28 is a schematic drawing illustrating a cross-section in the sensor height direction to explain a process for forming the sensor height in a method for fabricating a CPP type magneto-resistive sensor of the embodiment 4-4.

Next, a resist is coated on the magnetoresistive layer 3, exposed by using a stepper, and patterned into a desired shape by developing using a developer to make the resist mask 11 (FIG. 25(*a*), FIG. 26(*a*), FIG. 27(*a*), or FIG. 28(*a*)). Length A of the first stopper layer for track 51 in the sensor height direction during the track formation shown in FIG. 27(*a*) and FIG. 28(*a*) is one decided by the length of the resist mask 8 in the sensor height direction during track formation.

Next, dry-etching by using IBE and RIE, etc. is carried out on the first stopper layer for sensor height 41, the first stopper layer for track 51 during the track formation, and the magnetoresistive film 3 to form a pattern in the sensor height direction (FIG. 25(*b*), FIG. 26(*b*), FIG. 27(*b*), or FIG. 28(*b*)). In the case when IBE is used, it is possible to apply an etching in which the incident angle is changed during etching. In this case, it is preferable that ion beam etching be carried out again with the second incidence angle tilted greater than that of the first etching against the substrate. This process makes it possible to remove the redepositions deposited on the sensor wall during the first etching. Moreover, the redepositions deposited on the sensor wall can be removed by a plurality of repetition of alternating the first etching and the second etching. Furthermore, different etching techniques may be used for the first etching and the second etching.

Next, the refill film along sensor height direction 6 is deposited by using sputtering, ion beam sputtering, or a CVD technique (FIG. 25(*c*), FIG. 26(*c*), FIG. 27(*c*), or FIG. 28(*c*)). At least the part of the refill film along sensor height direction 6 connected to the magnetoresistive film 3 is formed of an insulator material such as Al oxide or Si oxide. Next, the second stopper layer for sensor height 42 is deposited to protect the refill film along sensor height direction 6 (FIG. 25(*d*), FIG. 26(*d*), FIG. 27(*d*), or FIG. 28(*d*)). The second stopper layer for sensor height 42 is one to protect the refill film along track width direction 1 and the longitudinal bias layer or side shield layer 5, and is composed of either DLC or the same metallic material as the first stopper layer for sensor height 41 described above.

Then, lift-off is carried out. First, the resist mask 11 is removed by using an organic solvent (FIG. 25(*e*), FIG. 26(*e*), FIG. 27(*e*), or FIG. 28(*e*)). At this time, there is a situation where a fence is created as shown in FIGS. 25(*d*), 26(*d*), 27(*d*), and 28(*d*) or where the resist mask 11 not completely removed, but these are removed by CMP applied in the next step. The process for removing the resist mask 11 using an organic solvent may be omitted. Next, CMP is applied and the fence 43 or the resist mask 11 which has not been removed is removed (FIG. 25(*f*), FIG. 26(*f*), FIG. 27(*f*), or FIG. 28(*f*)). Finally, the formation in the sensor height direction is completed by removing the stopper layer (FIG. 25(*g*), FIG. 26(*g*), FIG. 27(*g*), or FIG. 28(*g*)). In the embodiment 4-2 and the embodiment 4-4, only the second stopper layer for sensor height 42 is removed, and the first stopper layer for sensor height 41 is not removed.

When 20,000 elements which have the length of the resist mask 11 in the sensor height direction being 50 nm were manufactured by using 10 nm thick Rh for the first stopper layer for sensor height 41 and 10 nm thick DLC for the second stopper layer for sensor height 42 in the actual formation in the sensor height direction, lift-off was possible for all elements and there was no fence.

After this process, the upper shield layer 2 composed of a soft magnetic material is formed (FIG. 25(*h*), FIG. 26(*h*), FIG. 27(*h*), or FIG. 28(*h*)). When this upper shield layer 2 is formed, it may be possible that a metallic material such as Ta and NiCr, etc. is deposited on top of the magnetoresistive film 3 as an underlayer, and then the upper shield layer 2 is formed.

The cross-sectional drawing in the track width direction illustrating a magneto-resistive sensor fabricated by the embodiment 4-1 becomes a configuration shown in FIG. 24(*a*). The cross-sectional drawing in the track width direction illustrating a magneto-resistive sensor fabricated by the embodiment 4-2 becomes a configuration shown in FIG. 24(*b*). The cross-sectional drawing in the track width direction illustrating a magneto-resistive sensor fabricated by the embodiment 4-3 becomes a configuration shown in FIG. 29(*a*). The cross-sectional drawing in the track width direction illustrating a magneto-resistive sensor fabricated by the embodiment 4-4 becomes a configuration shown in FIG. 29(*b*). As described in the embodiment 4-2 and the embodiment 4-4, it is expected that the contact resistance between the magnetoresistive film 3 and the upper shield layer 2 is reduced by leaving the first stopper layer for sensor height 41, especially in the case when the track width of the magnetoresistive film 3 is small.

After this, the magneto-resistive sensor of the present invention can be obtained by forming the air bearing surface 13 by the slider formation process after passing the process for forming terminals or the process for forming a write sensor for recording information in a medium. FIG. 11 is a cross-sectional drawing in the sensor height direction illustrating a magneto-resistive sensor in which a write sensor is provided. In the case of longitudinal recording, a write sensor consists of a lower pole 18, an upper pole 19, a coil 20, a coil insulator 21, a recording gap 22, and an upper yoke 31 as shown in FIG. 11(*a*). Moreover, in the case of a perpendicular magnetic storage, a write sensor consists of an adjunct pole 23, a main pole 24, a coil 20, and a coil insulator 21 as shown in FIG. 11(*b*).

Furthermore, it is possible to fabricate a magnetic storage by mounting the magneto-resistive sensor 25 of the present invention at the tip of the gimbals 26, and by providing a recording medium 27, a voice coil 28, a spindle 29, and a signal processing circuit 30 as shown in FIG. 12.

Although the present invention as described in detail above with reference to the magnetoresistive film 3 was explained using one which consists of a pinned layer composed of a layer including a Co—Fe based alloy ferromagnetic, an intermediate layer composed of Al—O or Cu, etc., and a free layer composed of a layer including a Ni—Fe based alloy or a Co—Fe based alloy, these are specific examples and the present invention is not limited to these examples. Besides this structure, the effects of the present invention are not changed by reasonable variations and modifications of the devices which carry a detection current nearly in the direction perpendicular to the film surface of the material constituting the magnetoresistive film such as, for instance, a magnetoresistive film using a high polarizability material for the pinned layer or the free layer, a magnetoresistive film providing a current screen layer in the pinned layer, intermediate layer, and the free layer, a magneto-resistive sensor using a magnetic semiconductor, and a magneto-resistive sensor using a diffusion and accumulation phenomena of the polarized spin.

Moreover, although the aforementioned examples described a magneto-resistive sensor in which the magnetoresistive film 3 is arranged so as to be exposed to the air bearing surface 13, the same effects can be obtained in a magneto-resistive sensor in which a part of the magnetoresistive film 3 is arranged to be exposed to the air bearing surface and a magneto-resistive sensor in which the magnetoresistive film 3 is arranged separated from the air bearing surface.

Moreover, although the aforementioned examples described a method for fabricating a CPP type magneto-resistive sensor, the same method can be employed for fabricating a CIP type magneto-resistive sensor. In this case, an insulator layer has to be placed between the magnetoresistive film 3, the lower shield layer 4, and the upper shield layer 3. Moreover, the refill film along track width direction 1 is not necessary, and a longitudinal bias layer or side shield layer 5, which also works as an electrode, becomes necessary.

Since a narrower track in the magneto-resistive sensor can be achieved according to the present invention, the magnetic storage having a high recording density can be achieved by mounting in the magnetic storage a magneto-resistive sensor, which has a narrow track, fabricated by using a fabricating method of the present invention.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A magneto-resistive sensor which has a pair of magnetic shield layers consisting of a lower shield layer and an upper shield layer and a magnetoresistive film having a laminated structure placed between said pair of magnetic shield layers, and carries a signal current through a laminated plane of said magnetoresistive film, said magneto-sensitive sensor comprising:
    a first stopper layer made of a metallic layer on said magnetoresistive film;
    wherein a length of said first stopper layer in a sensor height direction is longer than a length of said magnetoresistive film in the sensor height direction.

2. A magneto-resistive sensor according to claim 1, wherein
    said first stopper layer is composed of a metallic material having a Vickers hardness of about 80 Hv or more.

3. A magneto-resistive sensor according to claim 1, wherein
    said first stopper layer is composed of a metallic material selected from a group of Co, Cr, Mo, Hf, Ir, Nb, Re, Rh, Ru, and W or an alloy including any in the group.

4. A magneto-resistive sensor which has a pair of magnetic shield layers consisting of a lower shield layer and an upper shield layer, and a magnetoresistive film having a laminated structure placed between said pair of magnetic shield layers, and carries a signal current through a laminated plane of said magnetoresistive film, said magneto-resistive sensor comprising,
    a first stopper layer made of a metallic layer on said magnetoresistive film;
    wherein a length of said first stopper layer in a track width direction is longer than a length of said magnetoresistive film in a track width direction.

5. A magneto-resistive sensor according to claim 4, wherein
    said first stopper layer is composed of a metallic material having a Vickers hardness of about 80 Hv or more.

6. A magneto-resistive sensor according to claim 4, wherein
    said first stopper layer is composed of a metallic material selected from a group of Co, Cr, Mo, Hf, Ir, Nb, Re, Rh, Ru, and W or an alloy including any in the group.

* * * * *